(12) United States Patent
Lung et al.

(10) Patent No.: US 10,818,729 B2
(45) Date of Patent: Oct. 27, 2020

(54) BIT COST SCALABLE 3D PHASE CHANGE CROSS-POINT MEMORY

(71) Applicant: MACRONIX INTERNATIONAL CO., LTD., Hsinchu (TW)

(72) Inventors: Hsiang-Lan Lung, Ardsley, NY (US); Erh-Kun Lai, Tarrytown, NY (US); Ming-Hsiu Lee, Hsinchu (TW); Chiao-Wen Yeh, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/233,524

(22) Filed: Dec. 27, 2018

(65) Prior Publication Data

US 2019/0355790 A1 Nov. 21, 2019

Related U.S. Application Data

(60) Provisional application No. 62/672,599, filed on May 17, 2018.

(51) Int. Cl.
*H01L 29/02* (2006.01)
*H01L 27/24* (2006.01)
(Continued)

(52) U.S. Cl.
CPC ............ *H01L 27/2481* (2013.01); *G11C 7/18* (2013.01); *G11C 8/14* (2013.01); *G11C 13/0004* (2013.01);
(Continued)

(58) Field of Classification Search
CPC . H01L 27/2481; H01L 45/06; H01L 45/1233; H01L 45/141; H01L 45/1616;
(Continued)

(56) References Cited

U.S. PATENT DOCUMENTS 5,194,752 A * 3/1993 Kumagai ............ G11C 11/4097
257/382
5,214,601 A * 5/1993 Hidaka .................. G11C 5/063
365/190

(Continued)

FOREIGN PATENT DOCUMENTS

| CN | 105051875 A | 11/2015 |
|----|-------------|---------|
| TW | I284413 B | 7/2007 |
| TW | I530953 B | 4/2016 |

OTHER PUBLICATIONS

TW Office Action from Application No. 108104675 dated Oct. 4, 2019, with English translation 13 pages.
(Continued)

*Primary Examiner* — Jay C Kim
(74) *Attorney, Agent, or Firm* — Haynes Beffel & Wolfeld LLP

(57) ABSTRACT

An integrated circuit includes a three-dimensional cross-point memory having a plurality of levels of memory cells disposed in cross points of first access lines and second access lines with alternating wide and narrow regions. The manufacturing process of the three-dimensional cross-point memory includes patterning with three patterns: a first pattern to define the memory cells, a second pattern to define the first access lines, and a third pattern to define the second access lines.

10 Claims, 19 Drawing Sheets

(51) Int. Cl.
  *H01L 45/00*    (2006.01)
  *G11C 13/00*    (2006.01)
  *G11C 8/14*     (2006.01)
  *G11C 7/18*     (2006.01)

(52) U.S. Cl.
  CPC .......... *H01L 45/06* (2013.01); *H01L 45/1233* (2013.01); *H01L 45/141* (2013.01); *H01L 45/1616* (2013.01); *H01L 45/1625* (2013.01); *H01L 45/1675* (2013.01); *G11C 2213/71* (2013.01)

(58) Field of Classification Search
  CPC ... H01L 45/1625; H01L 45/1675; G11C 7/18; G11C 8/14; G11C 13/0004
  USPC .......................................................... 257/2
  See application file for complete search history.

(56) References Cited

U.S. PATENT DOCUMENTS

| | | | | |
|---|---|---|---|---|
| 5,289,037 | A * | 2/1994 | Savignac | H01L 23/5226 257/758 |
| 5,305,252 | A * | 4/1994 | Saeki | H01L 27/10808 365/63 |
| 5,315,542 | A * | 5/1994 | Melzner | H01L 23/528 365/72 |
| 5,708,621 | A * | 1/1998 | Tanoi | G11C 8/14 365/230.06 |
| 5,802,000 | A * | 9/1998 | Hamada | G11C 7/18 365/205 |
| 5,864,496 | A * | 1/1999 | Mueller | G11C 7/18 365/69 |
| 5,959,321 | A * | 9/1999 | Lee | H01L 27/10844 257/296 |
| 6,043,562 | A * | 3/2000 | Keeth | G11C 7/18 257/210 |
| 6,185,120 | B1 * | 2/2001 | Takaishi | H01L 27/10808 257/E27.086 |
| 6,222,758 | B1 * | 4/2001 | Higashide | H01L 27/105 257/903 |
| 6,240,006 | B1 * | 5/2001 | Kawasaki | G11C 5/063 365/164 |
| 6,282,113 | B1 * | 8/2001 | DeBrosse | G11C 5/063 257/776 |
| 6,579,760 | B1 | 6/2003 | Lung | |
| 6,898,109 | B2 * | 5/2005 | Hirose | G11C 7/02 257/E21.656 |
| 7,064,051 | B2 * | 6/2006 | Lee | H01L 21/76897 257/E21.507 |
| 7,119,389 | B2 * | 10/2006 | Lee | H01L 27/10852 257/298 |
| 7,120,046 | B1 * | 10/2006 | Forbes | G11C 7/18 365/149 |
| 7,176,512 | B2 * | 2/2007 | Lee | H01L 27/0207 257/296 |
| 7,265,041 | B2 * | 9/2007 | Wu | H01L 27/0207 257/E29.136 |
| 7,307,889 | B2 * | 12/2007 | Takikawa | G11C 7/18 257/314 |
| 7,326,993 | B2 * | 2/2008 | Kajimoto | H01L 21/76838 257/315 |
| 7,348,640 | B2 * | 3/2008 | Yamada | G11C 11/15 257/202 |
| 7,492,033 | B2 * | 2/2009 | Sato | G11C 11/5678 257/401 |
| 7,675,770 | B2 * | 3/2010 | Asano | G11C 13/0004 365/148 |
| 7,742,330 | B2 * | 6/2010 | Takemura | G11C 13/0004 365/148 |
| 7,773,412 | B2 * | 8/2010 | Nazarian | G11C 5/063 365/185.02 |
| 7,985,989 | B2 | 7/2011 | Lung | |
| 8,026,604 | B2 * | 9/2011 | Kim | H01L 21/76801 257/415 |
| 8,054,674 | B2 * | 11/2011 | Tamai | G11C 11/5614 257/104 |
| 8,149,609 | B2 * | 4/2012 | Nagashima | G11C 8/10 365/148 |
| 8,173,987 | B2 | 5/2012 | Lung | |
| 8,258,496 | B2 * | 9/2012 | Toda | H01L 21/7682 257/5 |
| 8,363,464 | B2 * | 1/2013 | Takemura | G11C 13/0004 365/163 |
| 8,385,112 | B2 * | 2/2013 | Liu | G11C 13/0004 365/163 |
| 8,394,680 | B2 * | 3/2013 | Lee | H01L 27/10882 257/211 |
| 8,467,229 | B2 * | 6/2013 | Ikeda | G11C 13/0007 365/148 |
| 8,471,297 | B2 * | 6/2013 | Murata | H01L 27/2409 257/211 |
| 8,471,318 | B2 * | 6/2013 | Nam | H01L 21/76831 257/296 |
| 8,513,773 | B2 * | 8/2013 | Takemura | H01L 21/84 257/532 |
| 8,633,544 | B2 * | 1/2014 | Satoh | H01L 29/792 257/365 |
| 8,697,570 | B2 * | 4/2014 | Jeon | H01L 21/28525 438/647 |
| 8,729,523 | B2 * | 5/2014 | Pio | H01L 27/2427 257/5 |
| 8,742,261 | B2 * | 6/2014 | Lin | H05K 1/097 174/257 |
| 8,791,506 | B2 * | 7/2014 | Taylor | H01L 21/76283 257/203 |
| 8,841,648 | B2 * | 9/2014 | Chen | G11C 11/5685 257/2 |
| 8,848,424 | B2 * | 9/2014 | Ikeda | G11C 13/00 365/148 |
| 8,865,589 | B2 * | 10/2014 | Hashimoto | H01L 23/528 438/637 |
| 8,946,077 | B2 * | 2/2015 | Lee | H01L 27/10814 438/637 |
| 8,951,862 | B2 * | 2/2015 | Chen | H01L 27/11582 257/324 |
| 8,964,442 | B2 | 2/2015 | Lung | |
| 8,977,988 | B2 * | 3/2015 | Fang | G06F 17/5077 382/144 |
| 8,987,098 | B2 * | 3/2015 | Chen | H01L 27/11578 257/E27.07 |
| 9,064,746 | B2 * | 6/2015 | Crandall | H01L 27/1211 |
| 9,218,864 | B1 * | 12/2015 | Yi | H01L 43/08 |
| 9,245,603 | B2 * | 1/2016 | Yeh | H01L 27/11524 |
| 9,281,019 | B2 * | 3/2016 | Park | H01L 27/249 |
| 9,330,960 | B2 * | 5/2016 | Cho | H01L 21/764 |
| 9,397,110 | B2 | 7/2016 | Lue | |
| 9,589,979 | B2 | 3/2017 | Hong | |
| 9,721,961 | B2 * | 8/2017 | Okajima | H01L 27/2454 |
| 9,735,151 | B1 | 8/2017 | Apodaca et al. | |
| 9,768,115 | B2 * | 9/2017 | Choi | H01L 23/528 |
| 9,853,031 | B1 * | 12/2017 | Cho | H01L 29/4236 |
| 10,269,433 | B2 * | 4/2019 | Okajima | G11C 13/0028 |
| 10,319,726 | B2 * | 6/2019 | Nam | H01L 29/0646 |
| 10,388,601 | B2 * | 8/2019 | Brown | H01L 27/11582 |
| 10,475,815 | B2 * | 11/2019 | Lupino | H01L 27/2436 |
| 10,706,903 | B2 * | 7/2020 | Higo | G11C 11/16 |
| 2003/0185048 | A1 | 10/2003 | Fricke et al. | |
| 2006/0284259 | A1 * | 12/2006 | Lee | H01L 27/0207 257/365 |
| 2008/0304308 | A1 * | 12/2008 | Stipe | G11C 13/0007 365/51 |
| 2011/0017971 | A1 * | 1/2011 | Kim | H01L 27/2463 257/5 |
| 2011/0086483 | A1 * | 4/2011 | Choi | H01L 27/0207 438/264 |
| 2011/0242885 | A1 * | 10/2011 | Kim | G11C 13/0004 365/163 |

(56) References Cited

U.S. PATENT DOCUMENTS

2011/0305068 A1* 12/2011 Kitagawa ............ H01L 27/2472
   365/148
2013/0094273 A1   4/2013 Chien et al.
2014/0346428 A1  11/2014 Sills et al.

OTHER PUBLICATIONS

Kau, et al., "A stackable cross point phase change memory," 2009 International Electron Devices Meeting, Baltimore MD, Dec. 7-9, 2009, pp. 27.1.1-27.1.4.

Li et al., "Evaluation of SiO2 Antifuse in a 3D-OTP Memory," IEEE Transaction on Device and Materials Reliability, vol. 4, No. 3, Sep. 2004, 6 pages.

Sasago, et al., "Cross-point phase change memory with 4F2 cell size driven by low-contact-resistivity poly-Si diode," 2009 Symp. on VLSI Technology, Jun. 16-18, 2009, 2 pages.

TW Office Action from Application No. 108104675 dated Dec. 19, 2019, with English translation 10 pages.

\* cited by examiner

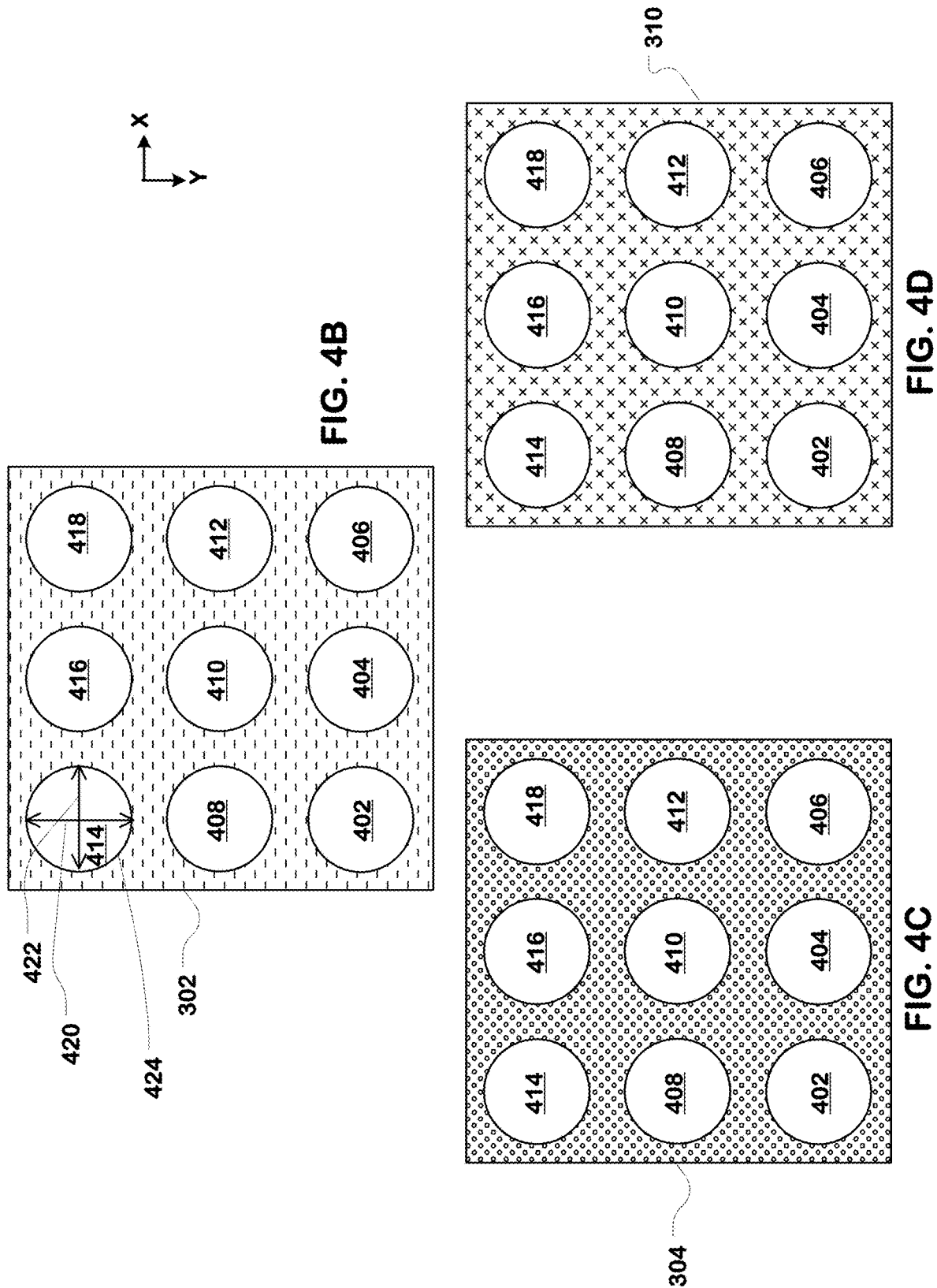

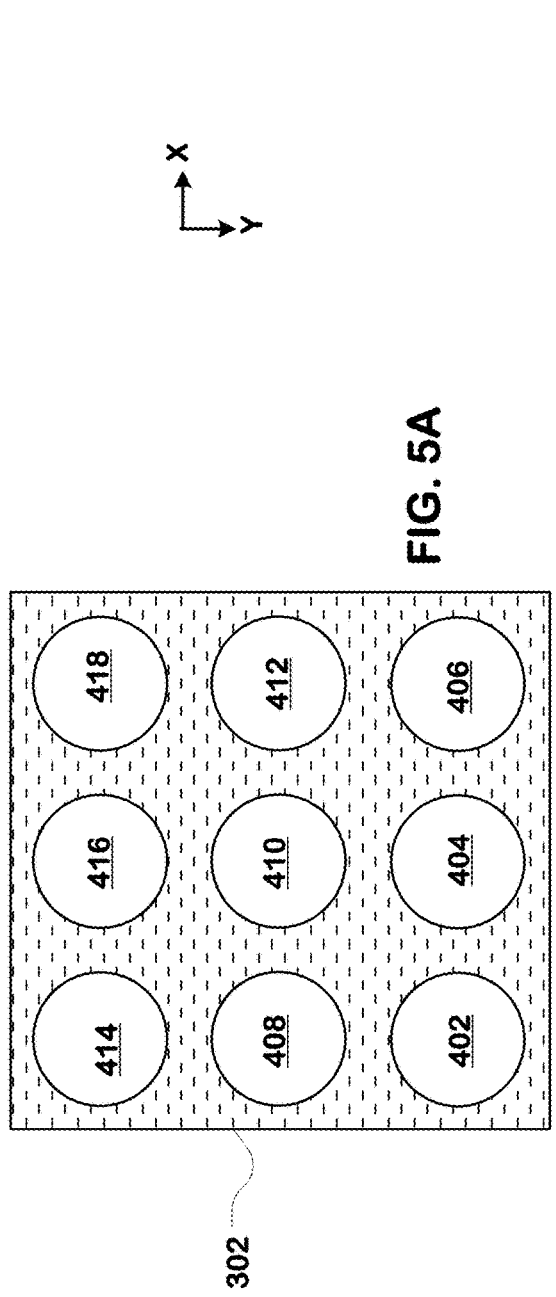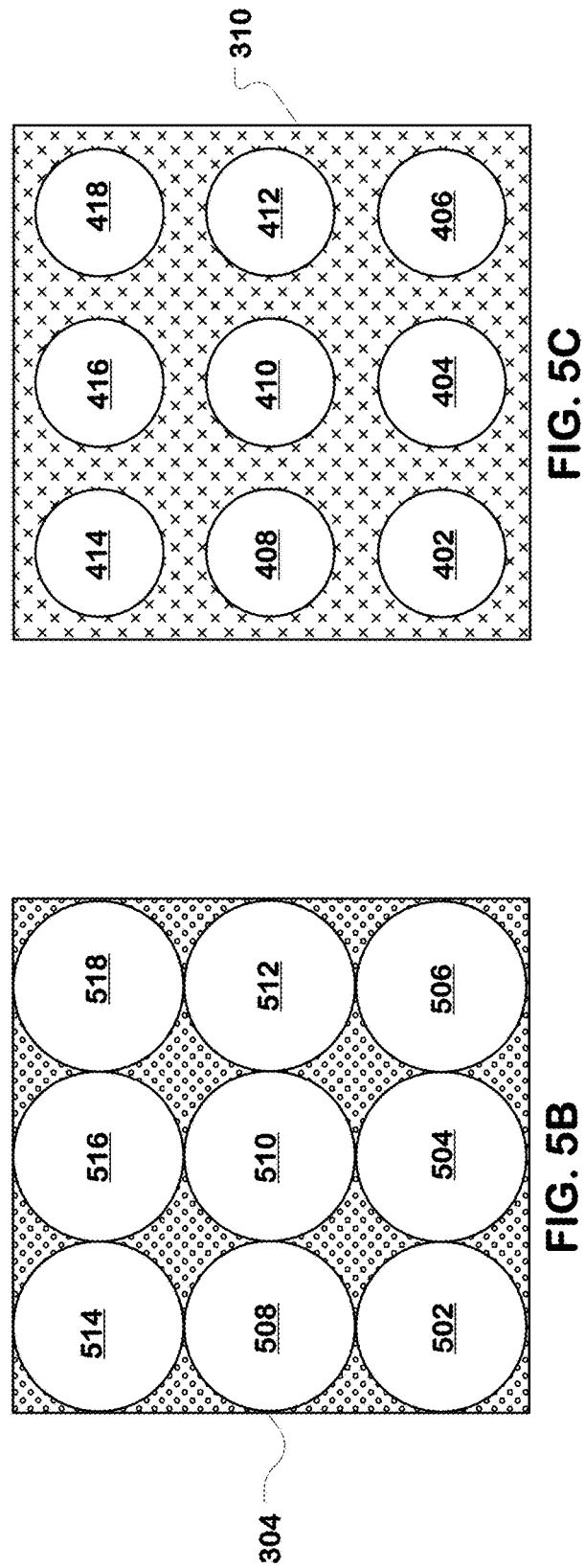

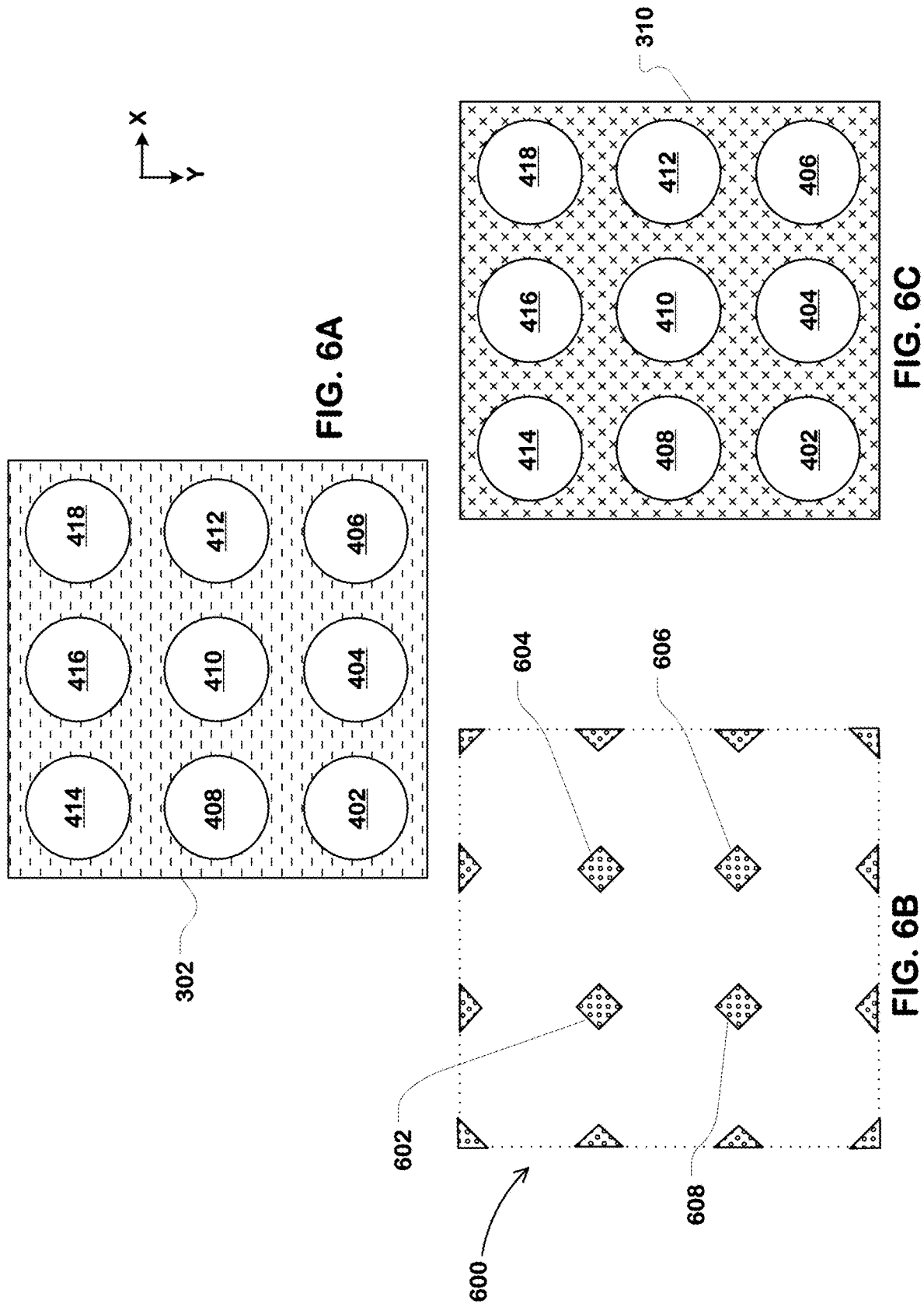

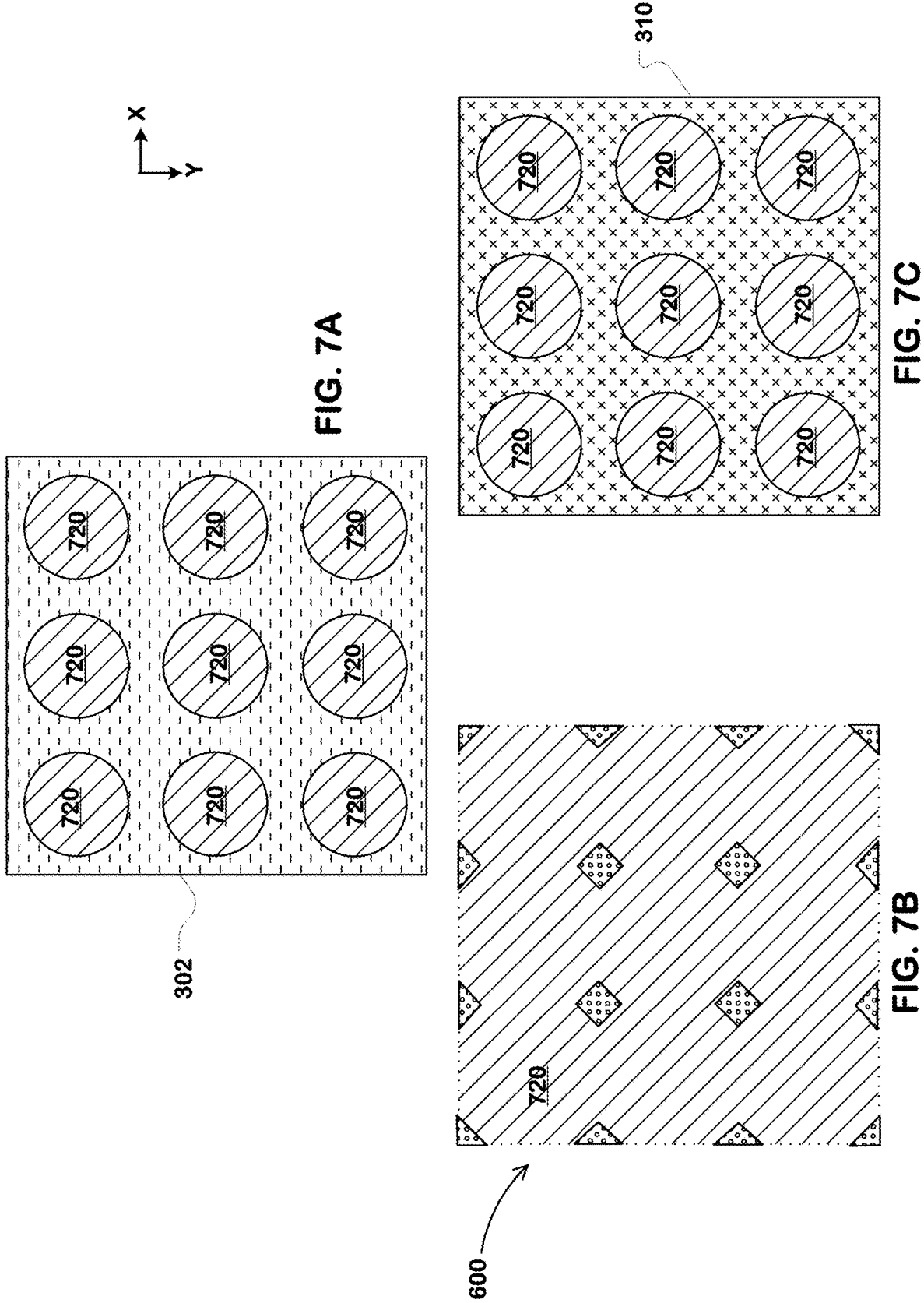

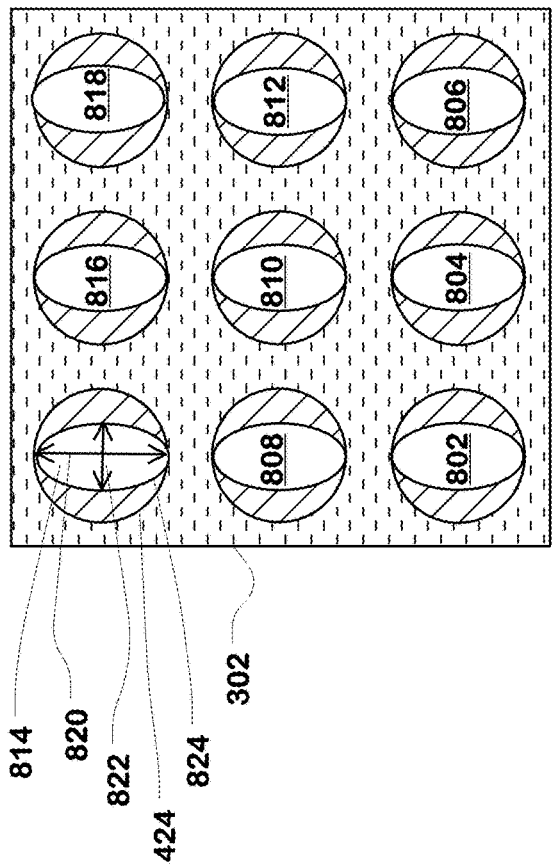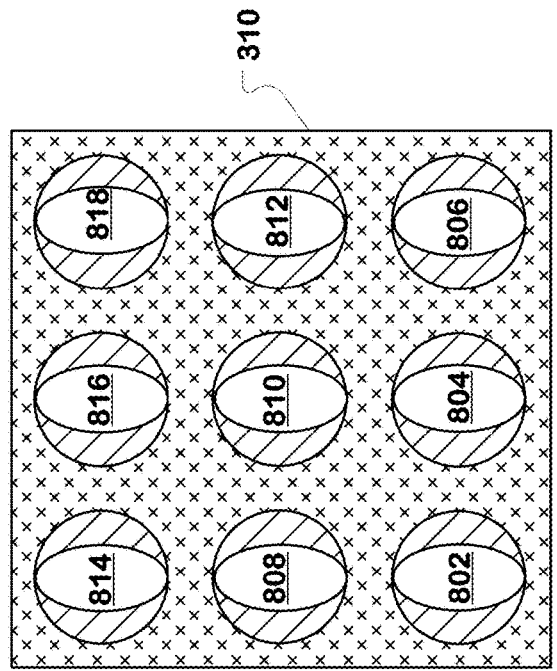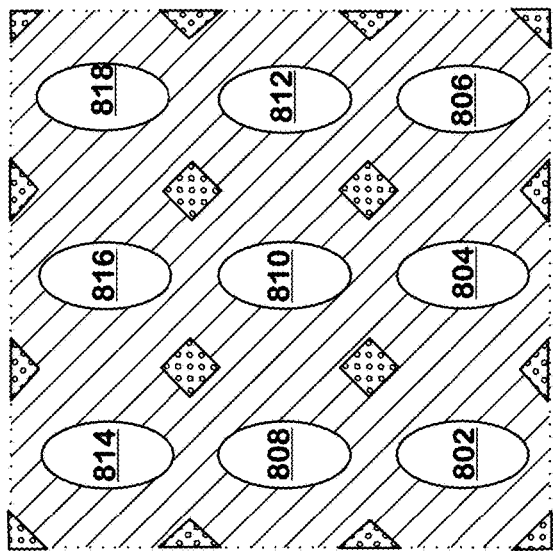

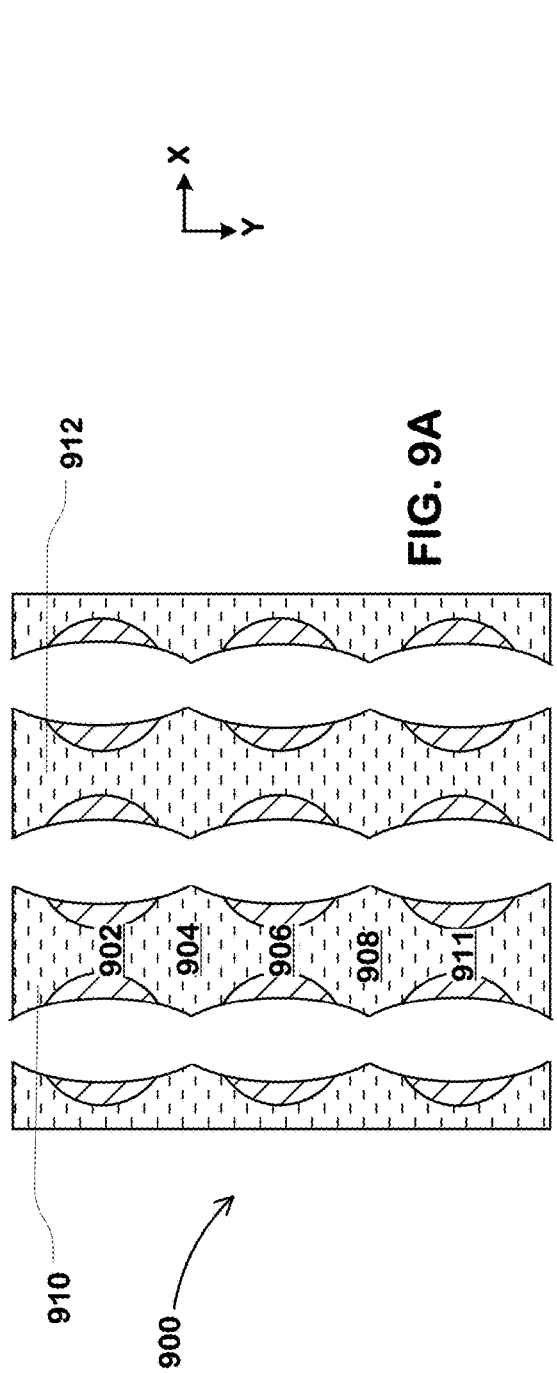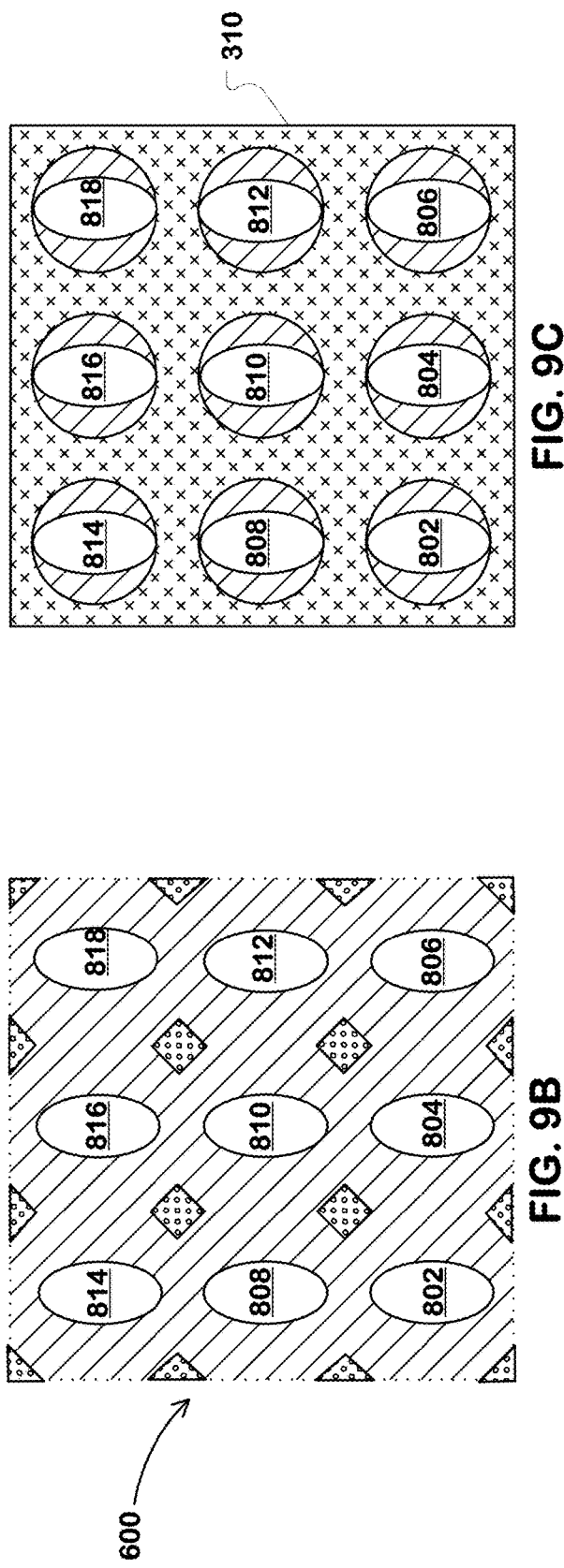

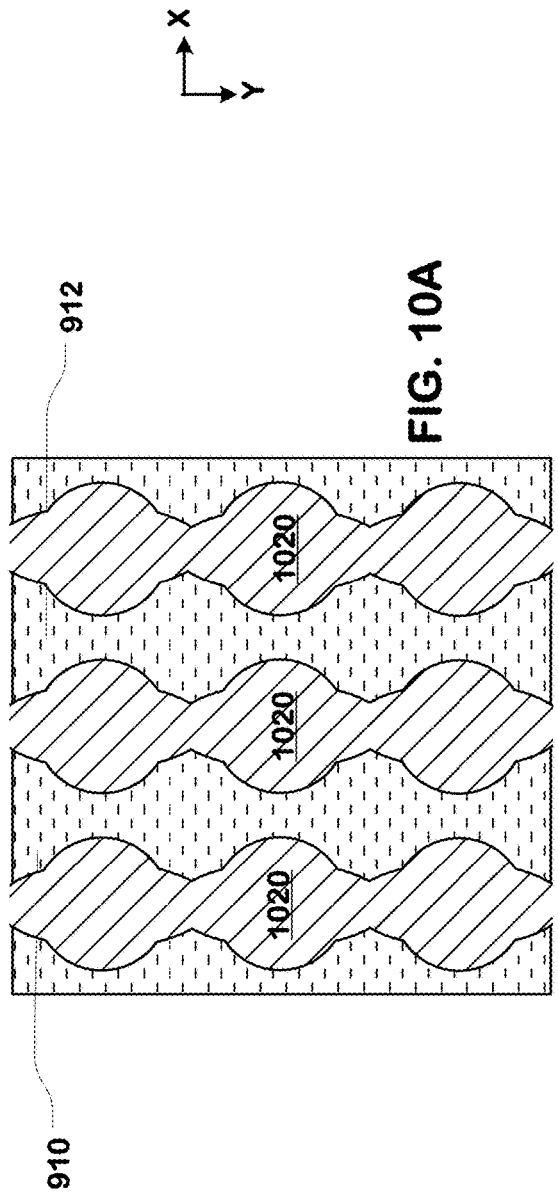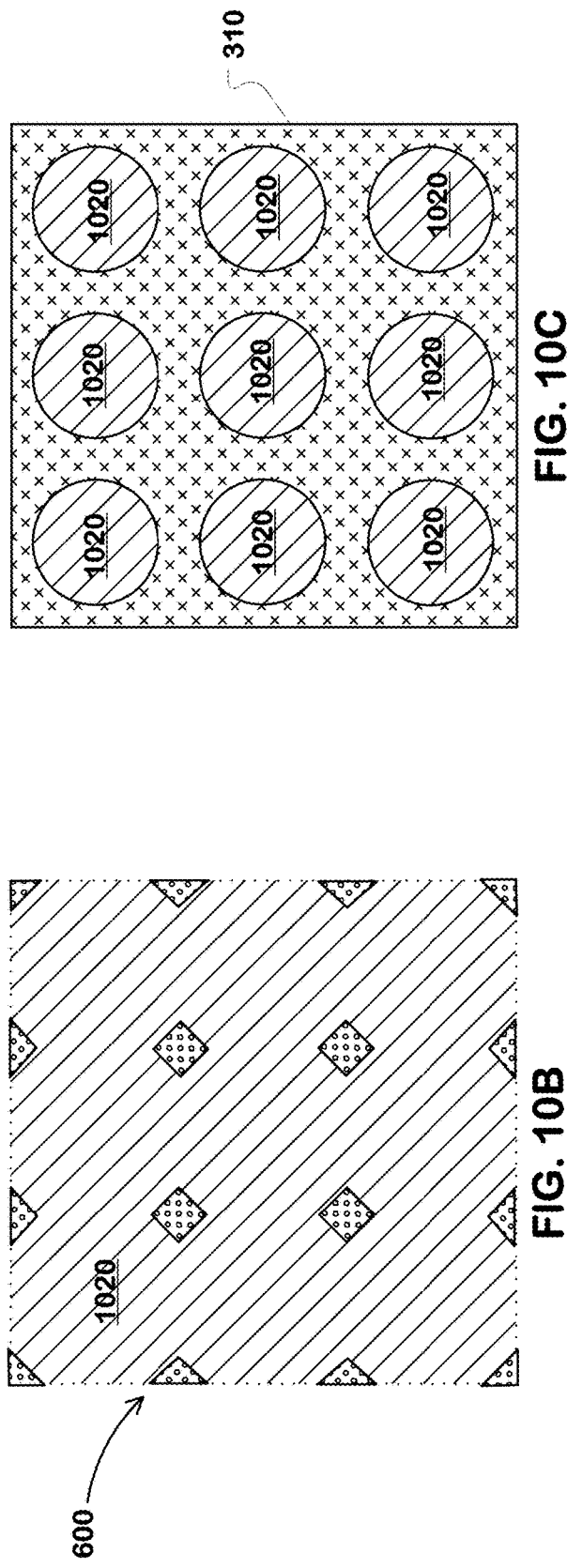
FIG. 10A
FIG. 10B
FIG. 10C

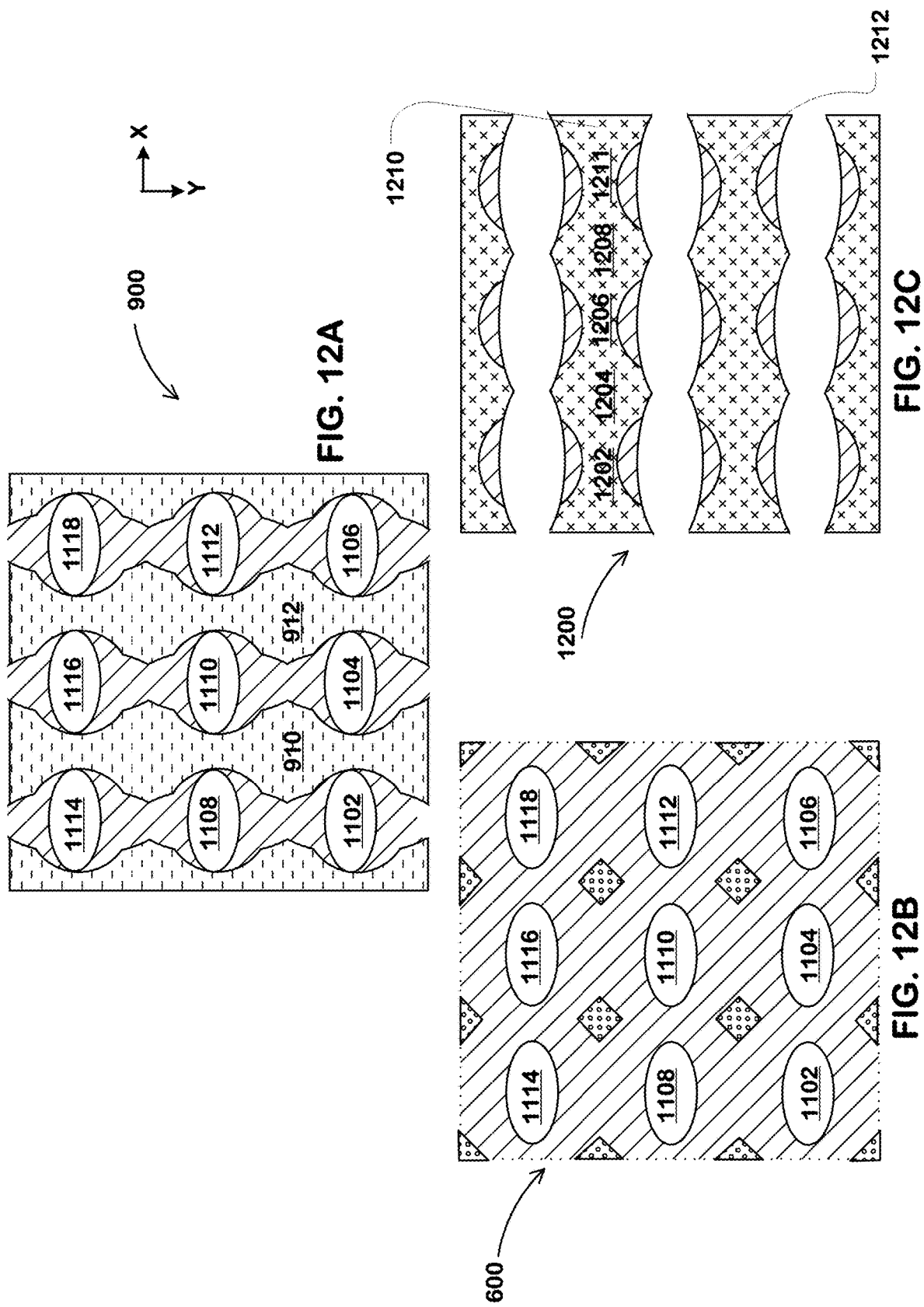

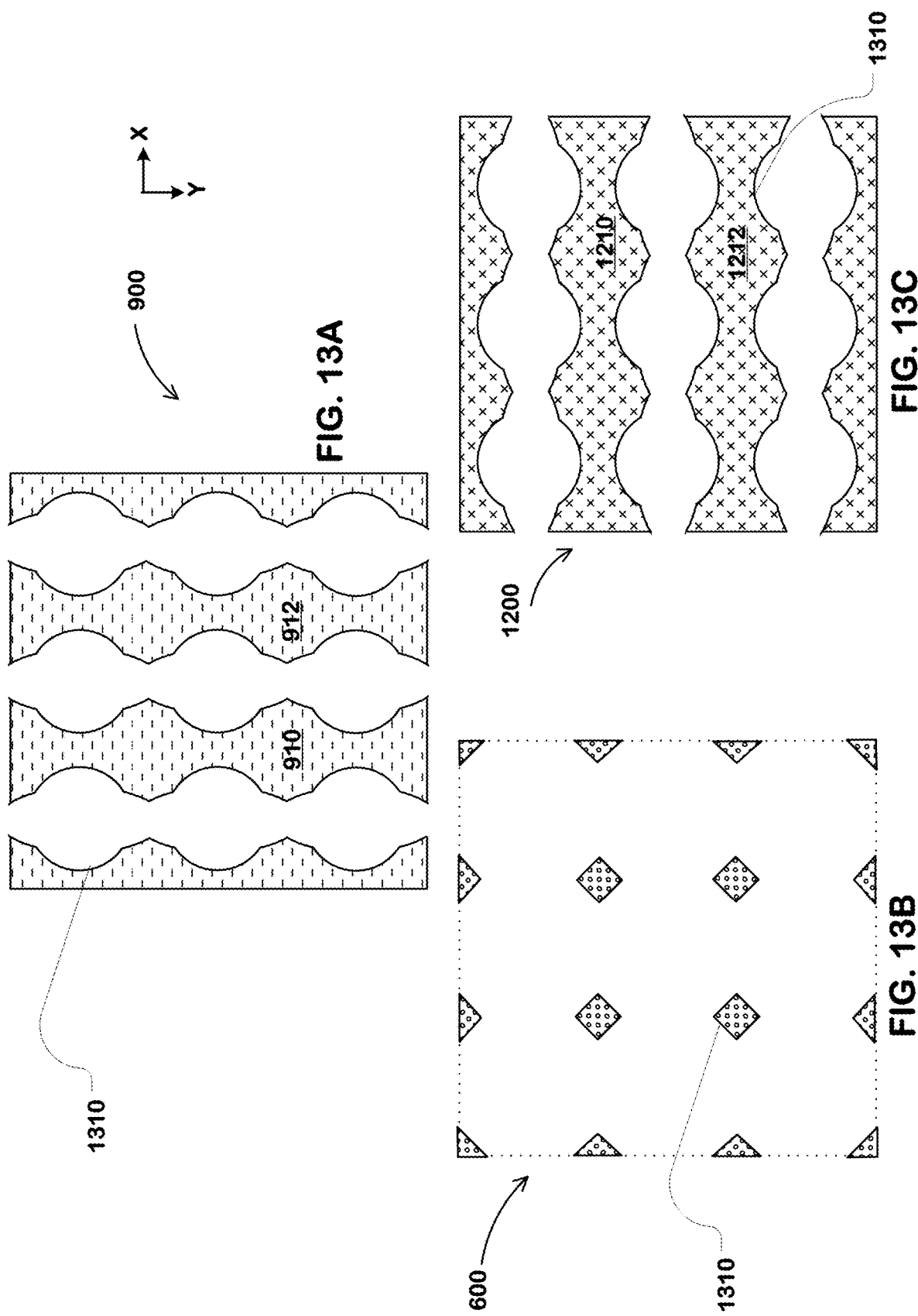

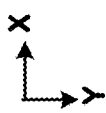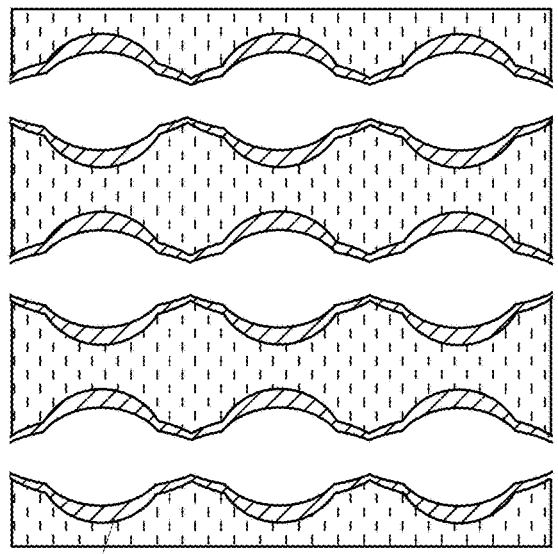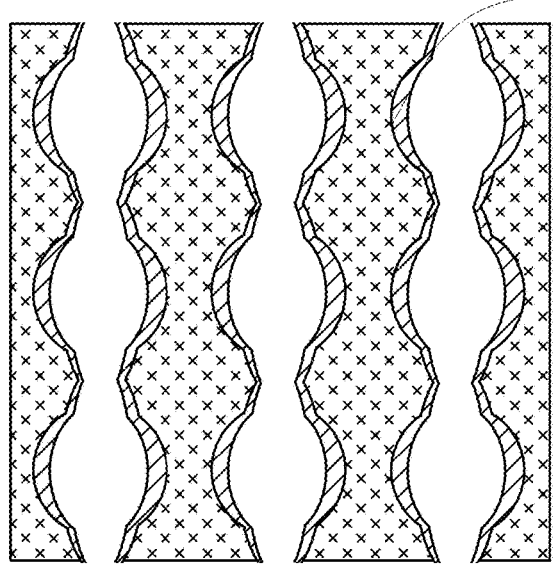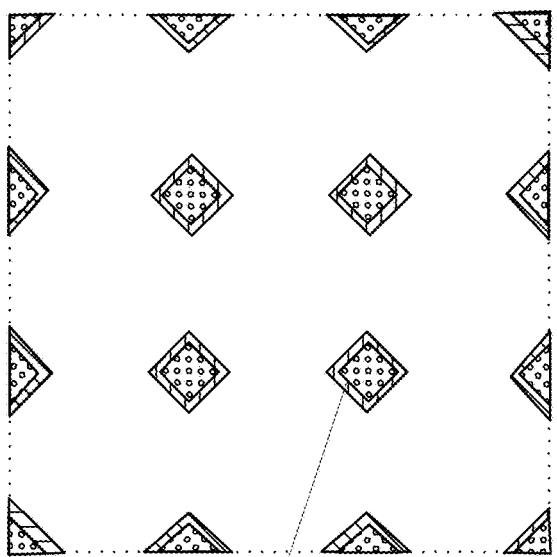

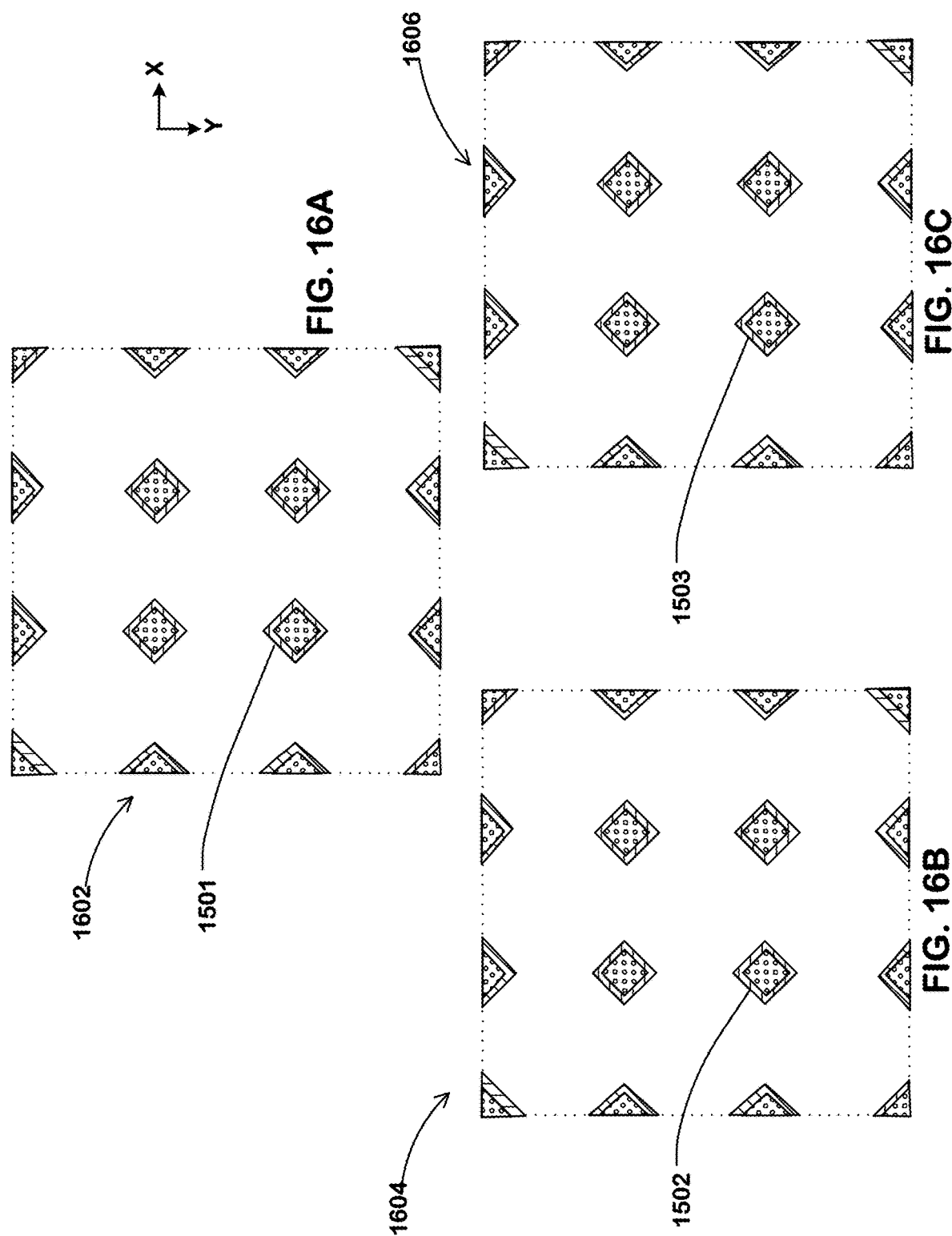

BIT COST SCALABLE 3D PHASE CHANGE CROSS-POINT MEMORY

PRIORITY APPLICATION

This application claims the benefit of U.S. Provisional Patent Application No. 62/672,599 filed 17 May 2018, which application is incorporated herein by reference.

BACKGROUND

Field

The technology described herein relates to integrated circuit memory technologies, including technologies using programmable resistance memory materials, including phase change materials, in 3D cross-point architectures, and methods for manufacturing such devices.

Description of Related Art

Many three-dimensional (3D) cross-point memory technologies using phase change material, and other programmable resistance materials, have been proposed. For example, Li et al., "Evaluation of $SiO_2$ Antifuse in a 3D-OTP Memory," IEEE Transactions on Device and Materials Reliability, Vol. 4, No. 3, September 2004, describes a polysilicon diode and an anti-fuse arranged as a memory cell. Sasago et al., "Cross-Point Phase Change Memory with $4F^2$ Cell Size Driven by Low-Contact-Resistivity Poly-Si Diode," 2009 Symposium on VLSI Technology Digest of Technical Papers, pages 24-25, describes a polysilicon diode and a phase change element arranged as a memory cell. Kau et al., "A Stackable Cross Point Phase Change Memory," IEDM 09-617, (2009) pages 27.1.1 to 27.1.4, describes a memory post including an ovonic threshold switch OTS as an access device with a phase change element. See also, Lung, U.S. Pat. No. 6,579,760 entitled SELF-ALIGNED, PROGRAMMABLE PHASE CHANGE MEMORY, issued Jun. 17, 2003.

In a 3D cross-point memory, multiple memory cells are vertically stacked upon one another to increase the amount of storage in an area available to store data. The memory cells are disposed at cross-points of an alternating arrangement of first access lines (e.g., bit lines or word lines) and second access lines (e.g, word lines or bit lines).

However, difficulties in manufacturing have limited success of 3D cross-point memories. There are several critical lithography steps for each memory layer. Thus, the number of critical lithography steps needed to manufacture the device is multiplied by the number of layers of memory cells that are implemented in some approaches. Critical lithography steps are expensive to implement.

As the need for higher and higher memory capacity in integrated circuit memories continues to increase, it is desirable to provide a method of manufacturing 3D cross-point memories with a low manufacturing cost while satisfying data retention requirements.

SUMMARY

One aspect of the technology includes a 3D cross-point memory, having a plurality of first access lines extending in a first direction in a first access line layer, and a plurality of second access lines extending in a second direction in a second access line layer. The first and second access lines have alternating wide regions and narrow regions. The wide regions in the second access lines in the second access line layer overlay the wide regions in the first access lines in the first access line layer at cross-points between the first and second access lines. An array of memory cells is disposed at cross-points between the first access lines and the second access lines. There can be many more levels of arrays of memory cells if desired. Each level of memory cell arrays comprises memory cells disposed at cross-points of first access lines extending in the first direction and second access lines extending in the second direction, where the cross-points occur in the wide regions of the first and second access lines. In some embodiments, the first access lines comprise a first conducting material and the second access lines comprise a second conducting material, the first conducting material being different than the second conducting material. The memory cells include a switch element, or steering device, such as an ovonic threshold switch, in series with a programmable memory element comprising a phase change material.

Another aspect of the technology is a method of manufacturing an integrated circuit including a 3D cross-point memory like that described above. The method includes forming a first stack of materials, including layers of the first conducting material, layers of materials of the programmable memory element, and layers of materials of the second conducting material. A plurality of first holes are etched through the first stack according to a first pattern. The layers of materials of the programmable memory element are laterally etched through the first holes to form an array of memory cells. A first insulating fill is then formed in the first holes. A plurality of second holes defined by a second pattern are etched through the first stack. The layers of the first conducting material are laterally etched through the second holes to form a plurality of first access lines. A second insulating fill is formed in the second holes. Then, third holes defined by a third pattern are etched through the first stack. The layers of the second conducting material are laterally etched through the third holes to form a plurality of second access lines.

In some embodiments, the first, second and third patterns comprise arrays of holes, the holes having a length in the first direction and a width in the second direction. The width of the holes in the second pattern is shorter than the width of the holes in the first pattern. In some embodiments, the length of the holes in the third pattern is shorter than the length of the holes in the first pattern. The holes in the second and third patterns can be elliptical, or like ellipses in the sense that they have major and minor axes (including rectangles and other oblong polygons). The major axes of the holes in the second pattern are aligned in the direction of the first access lines, and the sides of the first access lines are defined by the etch perimeter of the lateral etch of the first conducting material. The major axes of the holes in the third pattern are aligned in the direction of the second access lines, and the sides of the second access lines are defined by the etch perimeter of the lateral etch of the second conducting material. The holes in the first pattern can be circular, or have other shapes (including squares and other polygons) that have lengths and widths in the first and second directions that are approximately equal.

In some embodiments, the 3D cross-point memory described herein can be fabricated with three lithography steps: a first lithography for defining holes for formation of the memory cells by lateral etching at multiple levels in the 3D cross-point memory with the first pattern, a second lithography step for defining holes for formation of the first access lines by lateral etching with the second pattern, and a third lithography step for defining holes for formation of the second access lines by lateral etching with the third pattern. As the number of memory cell layers increases in 3D cross-point memories, the number of lithographic steps remains the same. By reducing the number of lithography steps, the average fabrication cost per layer of memory cells can decrease.

Other features, aspects, and advantages of the technology described herein can be understood with reference to the figures, the detailed description, and the claims set out below.

BRIEF DESCRIPTION OF THE DRAWINGS

FIGS. 3, 4A, 4B, 4C, 4D, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, and 14C illustrate stages of an example manufacturing process flow for manufacturing a 3D cross-point memory with first and second access lines with alternating wide regions and narrow regions.

FIGS. 16A, 16B, 16C, 17A, 17B, 18A, and 18B illustrate X-Y layouts of the 3D cross-point memory in FIG. 15.

DETAILED DESCRIPTION

A detailed description of embodiments of the present technology is provided with reference to the FIGS. 1-20.

Figure 1:
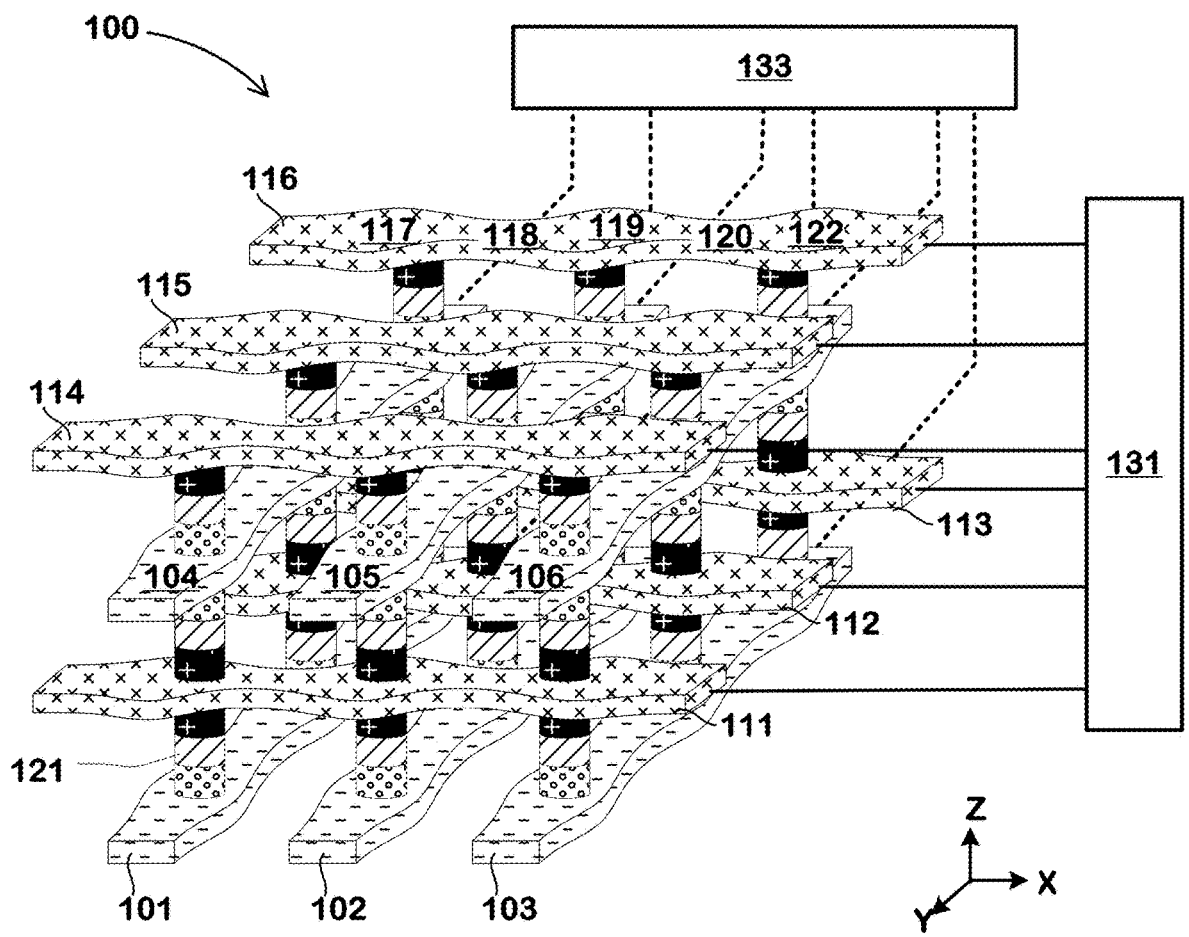
FIG. 1 illustrates a 3D cross-point memory with first and second access lines with alternating wide regions and narrow regions.

FIG. 1 illustrates a 3D cross-point memory 100 with first and second access lines with alternating wide and narrow regions. The 3D cross-point memory 100 includes a plurality of memory cells, including the memory cell 121. The plurality of memory cells are disposed at cross-points of a plurality of first access lines 101, 102, 103, 104, 105, and 106 extending in a first direction (i.e., the row direction, or the Y direction in FIG. 1), and a plurality of second access lines 111, 112, 113, 114, 115, and 116 extending in a second direction (i.e., the column direction, or the X direction in FIG. 1). The first and second access lines have alternating wide and narrow regions. For example, the second access line 116 has the wide region 117, the narrow region 118, the wide region 119, the narrow region 120 and the wide region 122, in series. The first direction and the second direction are orthogonal directions, or non-parallel directions, so that an array of cross points is formed between overlapping wide regions of the first and second access lines. Each memory cell is connected to a wide region of a particular first access line and a wide region of a particular second access line. For example, the memory cell 121 is connected to a wide region of the first access line 101 and a wide region of the second access line 111.

The 3D cross-point memory implemented in the configuration of FIG. 1 can have many levels of memory cells, and many first access lines and second access lines in each level for the formation of very high density memories. A 3D cross-point memory with multiple levels of memory cells has a plurality of first access line layers and a plurality of second access line layers interleaved with the first access line layers. Each first access line layer includes a plurality of first access lines, and each second access line layer includes a plurality of second access lines. The 3D cross-point memory in FIG. 1 comprises three levels of memory cells, two first access line layers, and two second access line layers. The consecutive levels of memory cells share either a first access line layer or a second access line layer. The first level of memory cells in the 3D cross-point memory is interposed between a first access line layer, including the first access lines 101, 102, and 103, and a second access line layer, including the second access lines 111, 112, and 113. The second level of memory cells in the 3D cross-point memory is interposed between a second access line layer, including the second access lines 111, 112, and 113, and a first access line layer, including the first access lines 104, 105, and 106. The third level in the 3D cross-point memory is interposed between a first access line layer, including the first access lines 104, 105, and 106, and a second access line layer, including the second access lines 114, 115, and 116. Other 3D configurations can be implemented.

The first access lines 101, 102, 103, 104, 105, and 106 comprise a first conducting material and the second access lines 111, 112, 113, 114, 115 and 116 comprise a second conducting material. The first and second conducting materials can comprise a variety of metals, metal-like materials, doped semiconductor access lines, or combinations thereof. Examples of first and second conducting materials include tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials.

In some embodiments, the first conducting material is different than the second conducting material in order to support lateral etch processes that are selective between the materials. For example, in one embodiment of the 3D cross-point memory in FIG. 1, the first conducting material in the first access lines can be tungsten and the second conducting material in the second access lines can be copper. In another example embodiment, the first conducting material in the first access lines can be titanium nitride and the second conducting material in the second access lines can be tungsten nitride.

The 3D cross-point array includes access lines coupled to and in electrical communication with a first access line decoder 133 and a second access line decoder 131, where the first and second access line decoders can include drivers and bias voltage selectors to apply bias voltages to selected and unselected first access lines and second access lines in the write or read operation. In this embodiment, the plurality of first access lines is coupled to a first access line decoder 133 and the plurality of second access lines is coupled to a second access line decoder 131. Sense amplifiers (not shown in FIG. 1) can be configured to connect to the first access lines or second access lines. In embodiments of the technology described herein, the sense amplifiers are coupled to one of the first and second access lines on which current source circuits, such as current mirror based load circuits, are connected that limit current during read and write operations.

Figure 2:
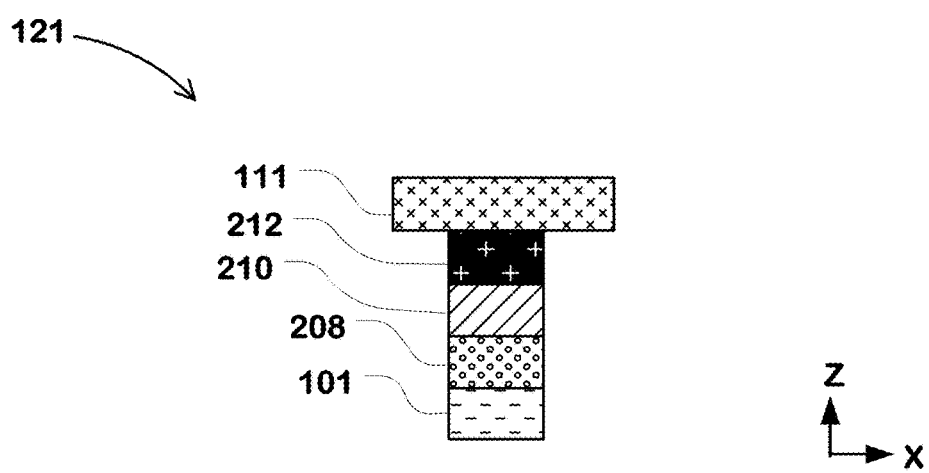
FIG. 2 illustrates an example memory cell.

FIG. 2 is a close-up view of an example memory cell 121 in FIG. 1. The memory cell 121 has a programmable memory element 208 in contact with the first access line 101 and a switch element 212 in contact with the second access line 111. A barrier layer 210 is disposed between the programmable memory element 208 and the switch element 212. In the 3D cross-point memory in FIG. 1, the memory cells are inverted such that the programmable memory elements can be in contact with, or proximal to, a first access line and the switch element can be in contact with, or proximal to, a second access line. In some embodiments, each level can have its own access line layers of first and second access lines. In some embodiments, the memory cells are not inverted such that the switch elements can be in contact with the first access lines or second access lines.

The programmable memory element 208 can comprise a layer of programmable resistance material. The programmable resistance material can have a first resistive value representing bit "0", and a second resistive value representing bit "1". In some embodiments, more than two resistive values can be used to store multiple bits per cell. In one embodiment, the programmable memory element 208 comprises a layer of phase change memory material as the programmable resistance material.

Phase change materials are capable of being switched between a relatively high resistance state, amorphous phase, and a relatively low resistance state, crystalline phase, by application of energy such as heat or an electrical current. Phase change materials are for the programmable memory element 208 can include chalcogenide-based materials and other materials. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be for example $Ge_2Sb_2Te_5$, $GeSb_2Te_4$ and $GeSb_4Te_7$. More generally, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. Specific examples of memory materials are disclosed in Ovshinsky, U.S. Pat. No. 5,687,112 at columns 11-13, which examples are incorporated by reference. Various phase change memories are described in U.S. Pat. No. 6,579,760, entitled SELF-ALIGNED, PROGRAMMABLE PHASE CHANGE MEMORY, incorporated by reference herein.

In one embodiment, the programmable memory element 208 may be a resistive random access memory or a ferroelectric random access memory. The programmable resistance material in the programmable memory element 208 may be a metal oxide such as hafnium oxide, magnesium oxide, nickel oxide, niobium oxide, titanium oxide, aluminum oxide, vanadium oxide, tungsten oxide, zinc oxide, or cobalt oxide. In some embodiments, other resistive memory structures can be implemented, such as metal-oxide resistive memories, magnetic resistive memories, conducting-bridge resistive memories, etc.

In some embodiments, the switch element 212 can be a two-terminal, bi-directional ovonic threshold switch (OTS), which comprises a chalcogenide material. In an embodiment including an OTS, a read operation involves applying a voltage across the first access line and second access line that exceeds a threshold of the OTS. In other embodiments, the switch element can comprise other types of devices, including directional devices such as a diode and other bi-directional devices.

In one example, an OTS switch element can comprise a layer of chalcogenide selected for use as an ovonic threshold switch, such as $As_2Se_3$, ZnTe, and GeSe, and has, for example, a thickness of about 5 nm to about 25 nm. In some embodiments, the switch element can comprise a chalcogenide in combination with one or more elements from the group consisting of tellurium (Te), selenium (Se), germanium (Ge), silicon (Si), arsenic (As), titanium (Ti), sulfur (S) and antimony (Sb).

The barrier layer 210 comprises a material or combination of materials selected to provide adequate adhesion between the switch element 212 and the programmable memory element 208, and blocks movement of impurities from the programmable memory element into the switch element and vice versa. The barrier layer can be consist of a conducting or a semiconducting material with a thickness of about 3 to about 30 nm. Appropriate materials for the barrier layer 210 may comprise a metal nitride, for example, titanium nitride (TiN), tantalum nitride (TaN), tungsten nitride (WN), molybdenum nitride (MoN), titanium silicon nitride (TiSiN), titanium aluminum nitride (TiAlN). In addition to metal nitrides, conductive materials, such as titanium carbide (TiC), tungsten carbide (WC), graphite (C), other carbon (C) forms, titanium (Ti), molybdenum (Mo), tantalum (Ta), titanium silicide (TiSi), tantalum silicide (TaSi), and titanium tungsten (TiW), can be used for the barrier layer 210.

FIGS. 3 through 14 illustrate an example manufacturing process flow for a 3D cross-point memory with first and second access lines with alternating wide and narrow regions like that of FIG. 1. The manufacturing process flow includes three patterns: a first pattern to define the memory cells, a second pattern to define the first access lines, and a third pattern to define the second access lines. The first pattern includes an array of holes, the holes having a length in the first direction and a width in the second direction. The holes in the first pattern may have a shape of a circle, a square, a rectangle, an ellipse, a polygon, etc. The holes in the first pattern can be circular, or have other shapes (including squares and other polygons) that have lengths and widths in the first and second directions that are approximately equal.

Figure 3:
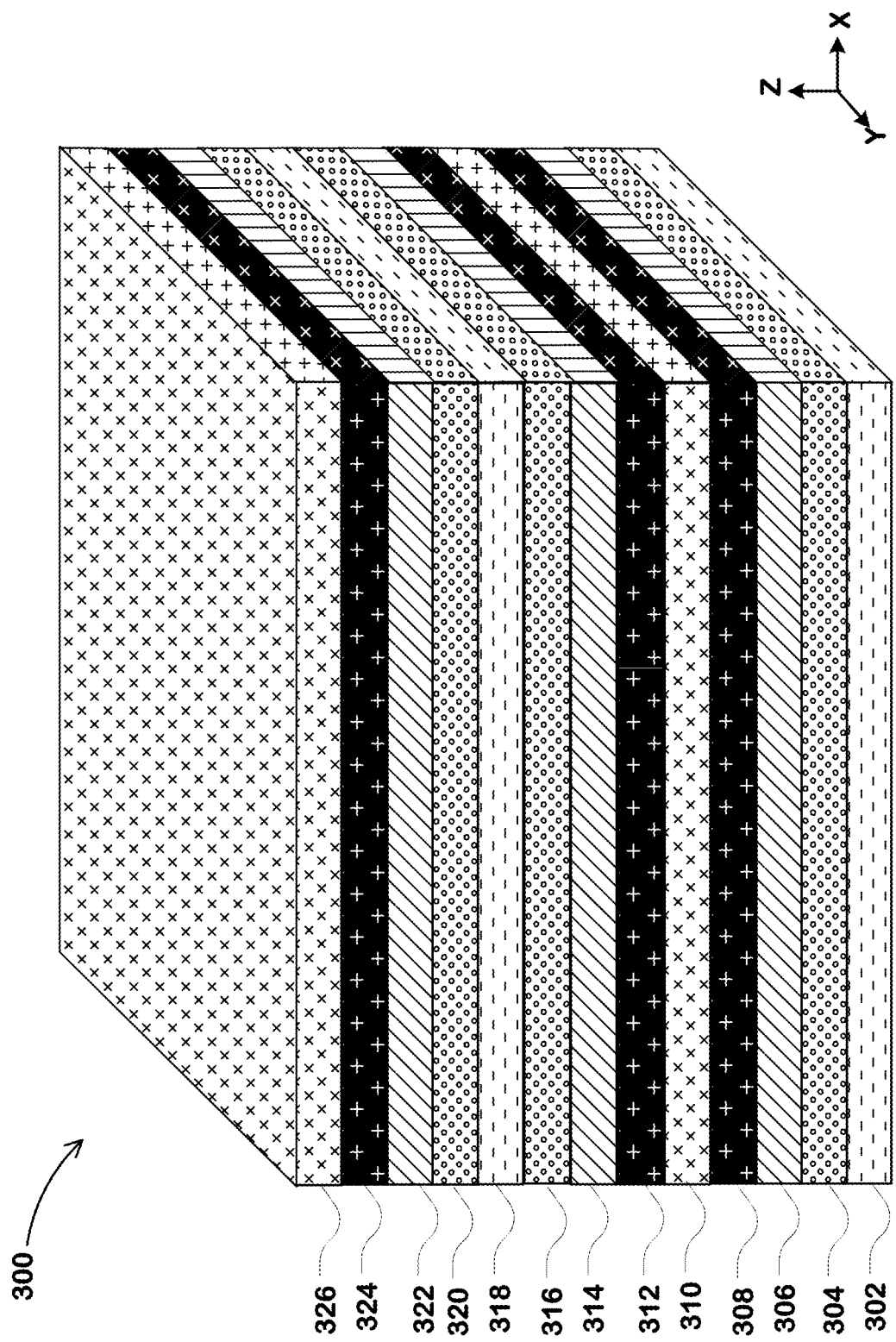

Similarly to the first pattern, the second and third patterns comprise arrays of holes, the holes having lengths in the first direction and widths in the second direction. The holes in the second and third patterns can be elliptical, or like ellipses in the sense that they have major and minor axes (including rectangles and other oblong polygons). The major axes of the holes in the second pattern are aligned in the direction of the first access lines, and the sides of the first access lines are defined by the etch perimeter of the lateral etch of the first conducting material. The major axes of the holes in the third pattern are aligned in the direction of the second access lines, and the sides of the second access lines are defined by the etch perimeter of the lateral etch of the second conducting material. In some embodiments, the width of the holes in the second pattern can be shorter than the width of the holes in the first pattern, and the length of the third pattern can be shorter than the length of the first pattern. The length of the second pattern may be the same as that of the first pattern, and the width of the third pattern may be the same as that of the first pattern in such embodiments. In other embodiments, the length of the second pattern can be shorter than the length of the first pattern, and the width of the third pattern is shorter than the width of the first pattern. The width of the second pattern may be the same as that of the first pattern, and the length of the second pattern may be the same as that of the first pattern in such embodiments. FIG. 3 illustrates a stage in the manufacturing process after forming a first stack 300 of materials with layers 302-326. The first stack 300 can be formed on an integrated circuit substrate or other types of insulating bases. There can be circuitry underlying the first stack 300 in some embodiments. The process of forming the first stack 300 involves depositing a first layer of the first conducting material 302, a first layer of materials of the programmable memory element 304, a first layer of materials of the barrier layer 306, a first layer of materials of the switch element 308, a first layer of a second conducting material 310, a second layer of materials of the switch element 312, a second layer of materials of the barrier layer 314, a second layer of materials of the programmable memory element 316, a second layer of the first conducting material 318, a third layer of materials of the programmable memory element 320, a third layer of materials of the barrier layer 322, a third layer of materials of the switch element 324, and a third layer of a second conducting material 326. A 3D cross-point memory cell device with three levels of memory cells can be formed from the first stack 300.

The first and second conducting materials in layers 302, 310, 318 and 326 can comprise a multilayer combination of titanium nitride, tungsten, and titanium nitride as mentioned above, the first conducting material being different than the second conducting material. Other combinations of materials can be utilized. These first and second conducting materials can be deposited using, for example, one or more of chemical vapor deposition (CVD), physical vapor deposition (PVD), and atomic layer deposition (ALD) processes.

The materials of the switch element in layers 308, 312 and 324 can comprise materials for an ovonic threshold switch element, such as those described above. In embodiments in which the programmable memory element comprises phase change material, the layers of materials of the switch element 308, 312 and 324 can be deposited by physical vapor deposition (PVD), sputtering, or a magnetron-sputtering method with source gas(es) of Ar, $N_2$, and/or He, etc. at the pressure of 1 mTorr~100 mTorr, for example. Alternatively, the layer also can be formed using chemical vapor deposition (CVD) and atomic layer deposition (ALD).

The materials of the barrier layer in layers 306, 314 and 322 can comprise a variety of barrier materials selected in accordance with the programmable resistance memory element. For a phase change memory element, a suitable barrier material can be titanium nitride. Alternative embodiments can comprise carbon varieties, including carbon nanotubes and graphene. Also, material such as silicon carbide and other conductive barrier materials can be utilized. These materials of the barrier layer can be deposited using, for example, one or more of chemical vapor deposition (CVD), physical vapor deposition (PVD), and atomic layer deposition (ALD) processes.

The materials of the programmable memory element in layers 304, 316 and 320 can comprise a variety of phase change material. Example phase change materials include chalcogenide-based materials such as alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. These materials of the programmable memory element can be deposited using, for example, one or more of chemical vapor deposition (CVD), physical vapor deposition (PVD), and atomic layer deposition (ALD) processes.

Figure 4A:
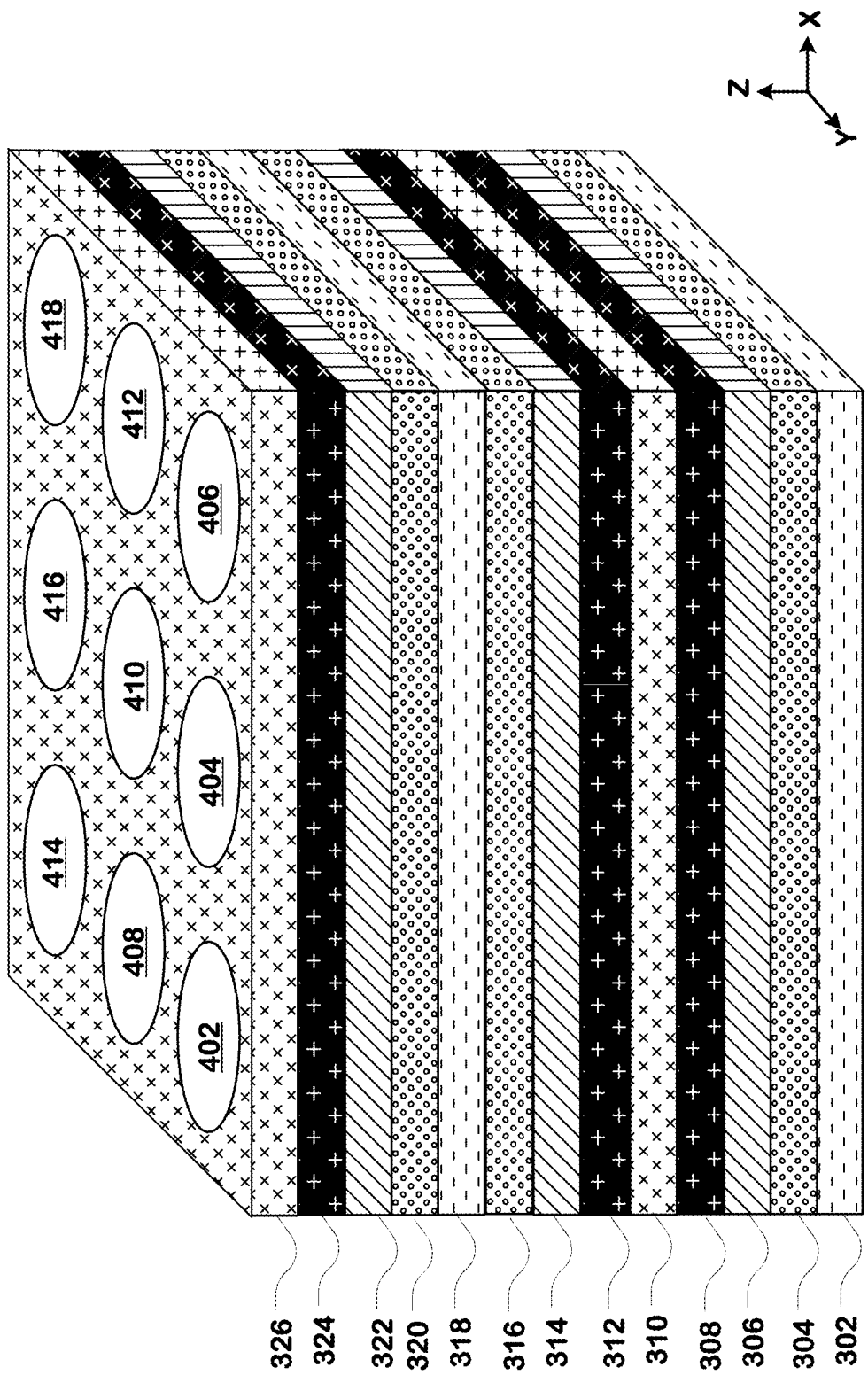

FIG. 4A illustrates a stage in manufacturing after patterning the first stack 300 to define an array of holes through the stack to the substrate in this embodiment. The array of holes includes a plurality of first holes 402, 404, 406, 408, 410, 412, 414, 416 and 418. FIGS. 4B, 4C, and 4D illustrate the X-Y layouts of the first layer of the first conducting material 302, the first layer of materials of the programmable memory element 304 and the first layer of a second conducting material 310, respectively. As illustrated in FIG. 4B, the array of holes is formed using a first hole pattern 424 to define the plurality of first holes 402, 404, 406, 408, 410, 412, 414, 416 and 418. The first hole pattern illustrated in FIG. 4B is a circle; however, other hole pattern shapes, such as a square or a polygon, can also be used. The first pattern has a length 420 in the first direction and a width 422 in the second direction. The first pattern defines first holes with lengths 420 in the first direction and widths 422 in the second direction. In this embodiment, the length 420 in the first direction and the width 422 in the second direction are about equal. The patterning of the plurality of first holes can be accomplished by a lithography process of depositing a photoresist on the first stack, exposing a first pattern in the photoresist, removing areas of exposed photoresist, etching areas not protected by photoresist, and removing the photoresist after etching.

FIGS. 5A, 5B and 5C illustrate the X-Y layouts of the first layer of the first conducting material 302, the first layer of materials of the programmable memory element 304 and the first layer of a second conducting material 310, respectively, during (before completion) the process of lateral etching through the plurality of first holes selective for the first layer of materials of the programmable memory element 304, and not for the second layer of materials of the programmable memory element 316, and not for the third layer of materials of the programmable memory element 320. The selective etching process does not etch (at least not substantially) the layers of the first conducting material or the layers of the second conducting material. As illustrated in FIG. 5, the etching process creates bigger holes 502, 504, 506, 508, 510, 512, 514, 516 and 518 in the first layer of materials of the programmable memory element 304 compared to the first holes 402, 404, 406, 408, 410, 412, 414, 416 and 418. A reactive-ion etching process can be used to etch layers of materials of the programmable memory element.

The first layer of materials of the barrier layer 306, the first layer of materials of the switch element 308, the second layer of materials of the switch element 312, the second layer of materials of the barrier layer 314, the third layer of materials of the barrier layer 322 and the third layer of materials of the switch element 324 are also laterally etched with the layers of materials of the programmable memory element 304, 316 and 320. In some embodiments, the layers of materials of the programmable memory element, the layers of materials of the barrier layer and the layers of materials of the switch element etch at the same rate. In some embodiments, the layers of materials of the programmable memory element, the layers of materials of the barrier layer and the layers of materials of the switch element etch at different rates, and the manufacturing process is modified such as by using multiple etch chemistries for lateral etching selective for the materials of the programmable memory element to ensure that the memory cells have more or less even side surfaces.

FIGS. 6A, 6B and 6C illustrate the X-Y layouts of the first layer of the first conducting material 302, the first layer of materials of the programmable memory element 304 and the first layer of a second conducting material 310, respectively, after completion of the selective lateral etching through the plurality of first holes of the first layer of materials of the programmable memory element 304, that does not remove the second layer of materials of the programmable memory element 316, and does not remove the third layer of materials of the programmable memory element 320. Upon completion of the lateral etch in this stage, memory cell pillars, separated from one another, are left by the perimeter of the lateral etch. The memory cell pillars provide a first level of memory cells 600 including memory cells 602, 604, 606 and 608, formed as the result of the etching process. Similarly, a second level of memory cells and a third level of memory cells are formed in the second layer of materials of the programmable memory element 316 and the third layer of materials of the programmable memory element 320, respectively.

FIGS. 7A, 7B and 7C illustrate the X-Y layouts of the first layer of the first conducting material 302, the first level of memory cells 600 and the first layer of a second conducting material 310, respectively, after forming a first insulating fill 720 in the first holes and the etched regions around the memory cells. The insulating fill can be formed by a deposition of silicon oxide, or other insulating fill materials suitable for the cross-point architecture. Other low dielectric constant (low-κ) dielectrics can be used as well. The formation of the first insulating fill can be implemented using a spin-on process, CVD, ALD, PVD, LPCVD, and HDP-CVD, for example.

FIGS. 8A, 8B and 8C illustrate a stage in manufacturing after patterning to form an array of second holes including a plurality of second holes 802, 804, 806, 808, 810, 812, 814, 816 and 818, aligned with the array of first holes. FIGS. 8A, 8B, and 8C illustrate the X-Y layouts of the first layer of the first conducting material 302, the first level of memory cells 600 and the first layer of a second conducting material 310, respectively. As illustrated in FIG. 8A, the array of second holes can use a second hole pattern 824 to define the plurality of second holes 802, 804, 806, 808, 810, 812, 814, 816 and 818 having an elliptical or oblong shape. The second hole pattern 824 has a length 820 (major axis) in the first direction that is approximately equal to the length of the first hole pattern 424 and a width 822 (minor axis) in the second direction that is shorter than the width of the first hole pattern 424. The length 820 of the second hole pattern 824 is longer than the width 822 of the second hole pattern 824. The second pattern defines second holes with lengths 820 (major axes) in the first direction and widths 822 (minor axes) in the second direction, the lengths of the second holes being longer than the widths of the second holes. The patterning of the plurality of second holes can be done by a lithography process. The second holes are patterned between the memory cells as illustrated in FIG. 8B.

FIGS. 9A, 9B and 9C illustrate a stage in manufacturing after selective lateral etching of the first conducting material 302 through the second holes 802, 804, 806, 808, 810, 812, 814, 816 and 818 to form a plurality of first access lines (e.g. 910, 912). FIGS. 9A, 9B and 9C illustrate the X-Y layouts of a first access line layer 900 formed from the first conducting material 302 including first access lines having sides defined by the perimeter of the selective lateral etch, the first layer of materials of the programmable memory element 304 and the first layer of a second conducting material 310. The selective etching process does not etch the memory cells or the layers of the second conducting material, as the second conducting material and the materials in the memory cells are different than the first conducting material. A reactive-ion etching process can be used to etch layers of materials of the first conducting material 302.

As illustrated in FIG. 9A, as the etching process takes place through second holes with lengths in the first direction longer than the widths in the second direction, a plurality of first access lines with alternating wide and narrow regions are formed as a result of the etching process. For example, the first access line layer 900 includes the first access line 910 and the first access line 912. The first access line 910 has a narrow region 902, a wide region 904, a narrow region 906, a wide region 908 and a narrow region 911 in series.

FIGS. 10A, 10B and 10C illustrate a stage in manufacturing after forming a second insulating fill 1020 in the second holes. FIGS. 10A, 10B and 10C illustrate the X-Y layouts of the first access line layer 900, the first level of memory cells 600 and the first layer of a second conducting material 310, respectively, after forming the second insulating fill 1020 in the second holes and the etched regions around the first access lines. The second insulating fill can be formed by a deposition of silicon oxide, or other insulating fill materials suitable for the cross-point architecture. Other low dielectric constant (low-κ) dielectrics can be used as well. The formation of the second insulating fill can be implemented using a spin-on process, CVD, ALD, PVD, LPCVD, and HDPCVD, for example.

Figure 11A:
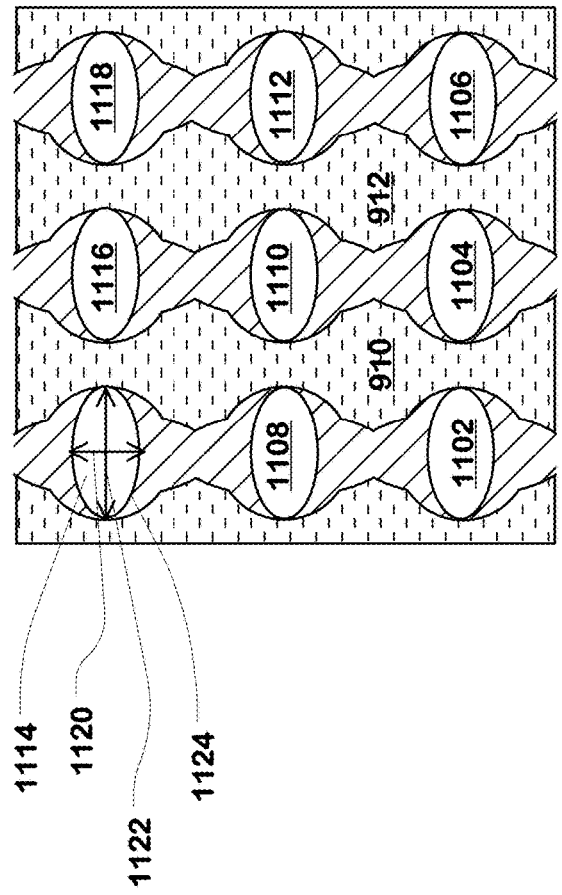
Figure 11C:
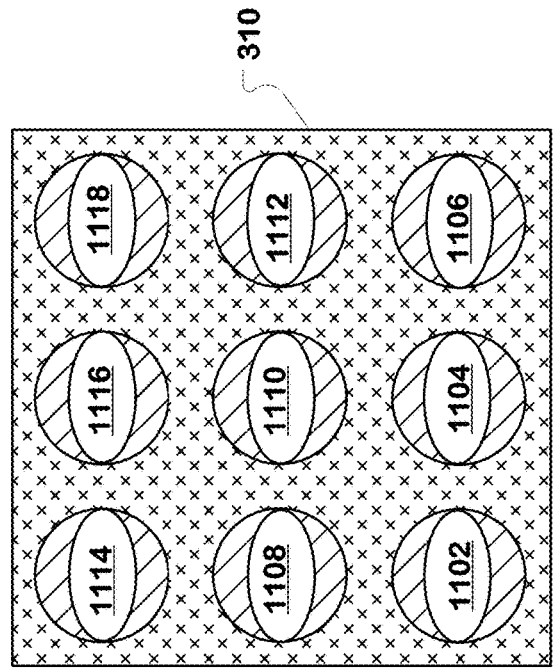
Figure 11B:
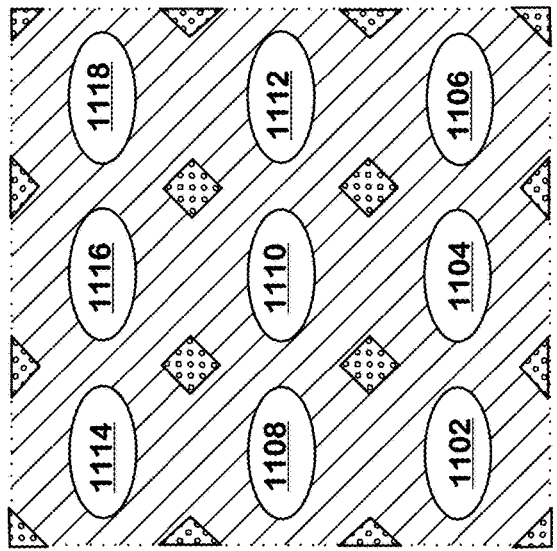

FIGS. 11A, 11B and 11C illustrate a stage in manufacturing after patterning an array of third holes aligned with the array of first holes, including a plurality of third holes 1102, 1104, 1106, 1108, 1110, 1112, 1114, 1116 and 1118. FIGS. 11A, 11B, and 11C illustrate the X-Y layouts of the first access line layer 900, the first level of memory cells 600 and the first layer of a second conducting material 310, respectively. As illustrated in FIG. 11A, a third hole pattern 1124 can be used to define the plurality of third holes 1102, 1104, 1106, 1108, 1110, 1112, 1114, 1116 and 1118. The third hole pattern 1124 has a length 1120 (minor axis) in the first direction that is shorter than the length of the first hole pattern and a width 422 (major axis) in the second direction that is approximately equal to the width of the first hole pattern 424. The length 1120 of the third hole pattern 1124 is shorter than the width 1122 of the third hole pattern 1124. The third hole pattern defines third holes with lengths 1120 in the first direction and widths 1122 in the second direction, the lengths of the second holes being shorter minor axes in length dimension) than the widths of the second holes (i.e. major axes in width dimension). The patterning of the plurality of third holes can be accomplished by a lithography process. The third holes are patterned between the memory cells as illustrated in FIG. 11B.

FIGS. 12A, 12B and 12C illustrate a stage in manufacturing after selective lateral etching of the second conducting material through the third holes 1102, 1104, 1106, 1108, 1110, 1112, 1114, 1116 and 1118 to form a plurality of second access lines including second access lines having sides defined by the perimeter of the selective lateral etch. FIGS. 12A, 12B and 12C illustrate the X-Y layouts of a first access line layer 900, the first level of memory cells 600 and a second access line layer 1200 formed from the first layer of the second conducting material 310.

The selective etching process does not etch the memory cells or the first access lines, as the first conducting material and the materials in the memory cells are different than the second conducting material. A reactive-ion etching process can be used to etch layers of the second conducting material.

As illustrated in FIG. 12C, as the etching process takes place through a third array of holes with lengths in the first direction shorter than the widths in the second direction, a plurality of second access lines with alternating wide and narrow regions are formed as a result of the etching process. For example, the second access line layer 1200 includes the second access line 1210 and the second access line 1212. The second access line 1210 has a narrow region 1202, a wide region 1204, a narrow region 1206, a wide region 1208 and a narrow region 1211, in series.

FIGS. 13A, 13B and 13C illustrate a stage in manufacturing after removing the first insulating fill and the second insulating fill by an etching process. FIGS. 13A, 13B and 13C illustrate the X-Y layouts of the first access line layer 900, the first level of memory cells 600 and the second access line layer 1200. The removing process exposes surfaces 1310 of the memory cells, first access lines and second access lines.

FIGS. 14A, 14B and 14C illustrate the X-Y layouts of the first access line layer 900, the first level of memory cells 600 and the second access line layer 1200 after lining the exposed surfaces 1310 with a dielectric material to form dielectric liners 1410. The dielectric liner 1410 can include dielectric material, having, for example, a dielectric such as SiOx, SiNx, Al2O3, HfO2, ZrO2, La2O3, AlSiO, HfSiO, and ZrSiO, etc., where high-κ dielectrics such as SiNx and HfO2 are preferred in some embodiments. High-κ dielectrics have dielectric constants higher than the dielectric constant of SiO2. The thickness of the high-κ dielectric liner can be in the range of 0.1 nm to 20 nm in some embodiments. Thicknesses in a range of 1 nm to 3 nm are preferred in some embodiments. A dielectric liner can be deposited using highly conforming chemical vapor deposition or atomic layer deposition. Voids can be formed between the memory cells in the structure between the access lines.

In some embodiments, a layer of dielectric material may be deposited on top of the 3D cross-point memory to protect the memory during later fabrication steps, such as back end of line (BEOL) fabrication steps. In some embodiments, the dielectric liners on top of the topmost access line layer can be merged to form a dielectric layer on top of the 3D cross-point memory.

In some embodiments, after lining the exposed surfaces with a dielectric material to form dielectric liners, a non-high-κ dielectric material can be used to fill the voids. Air gaps can be formed inside the dielectric material between the memory pillars.

In some embodiments, after selective lateral etching of the second conducting material through the third holes, a high-κ dielectric material can be used to fill the voids crated during the lateral etching process and the third holes.

Figure 15:
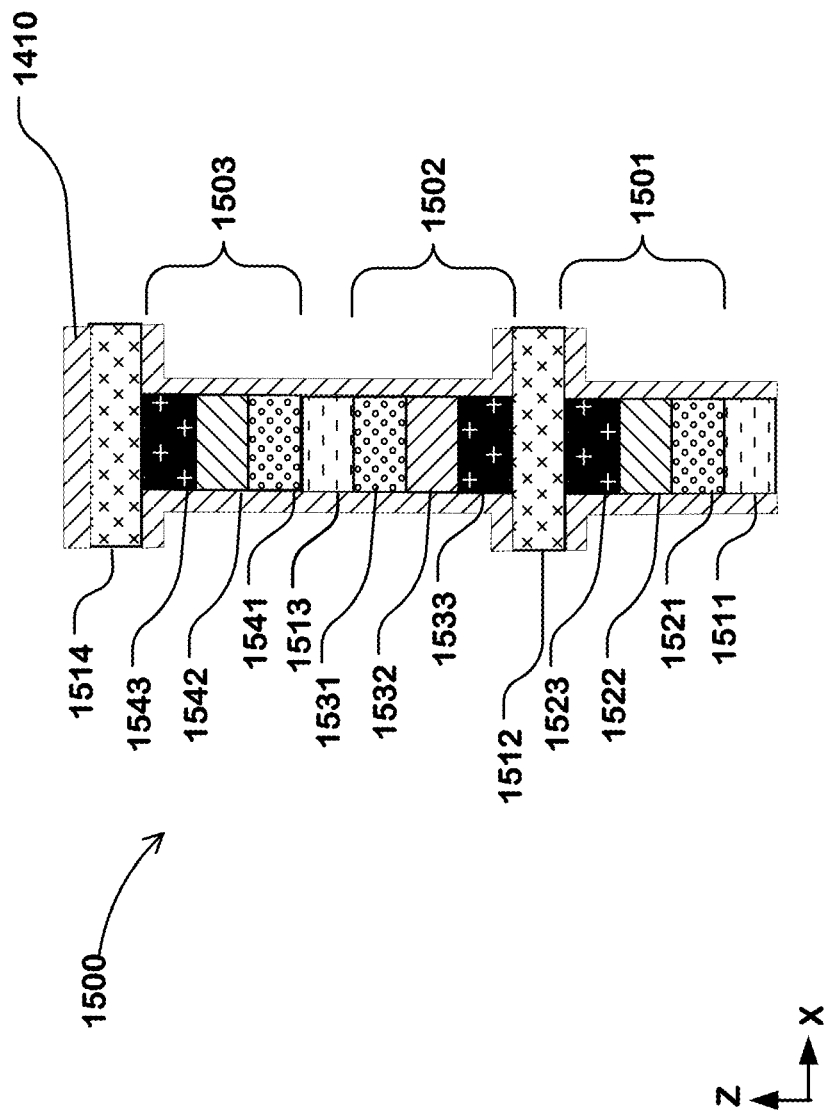
FIG. 15 illustrates an X-Z cross-section view of a 3D cross-point memory fabricated with the example manufacturing process.
Figure 17A:
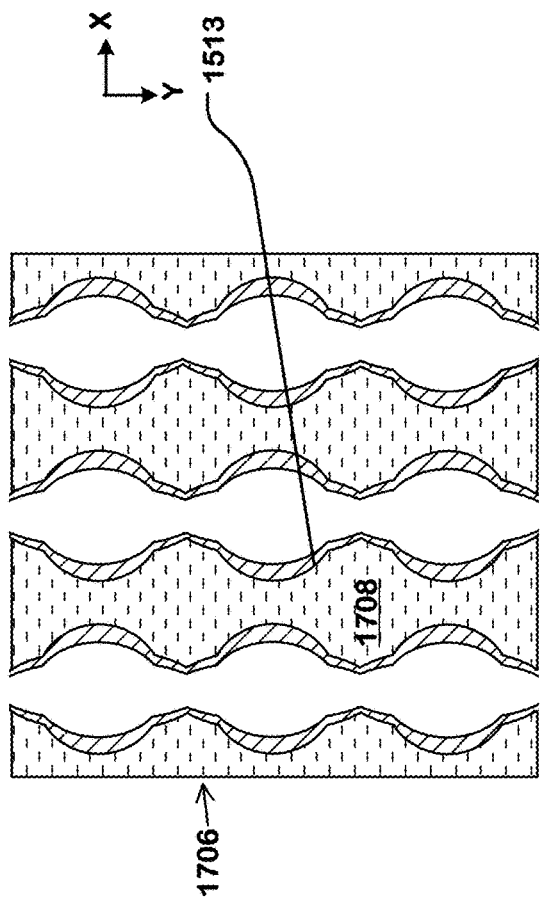
Figure 17B:
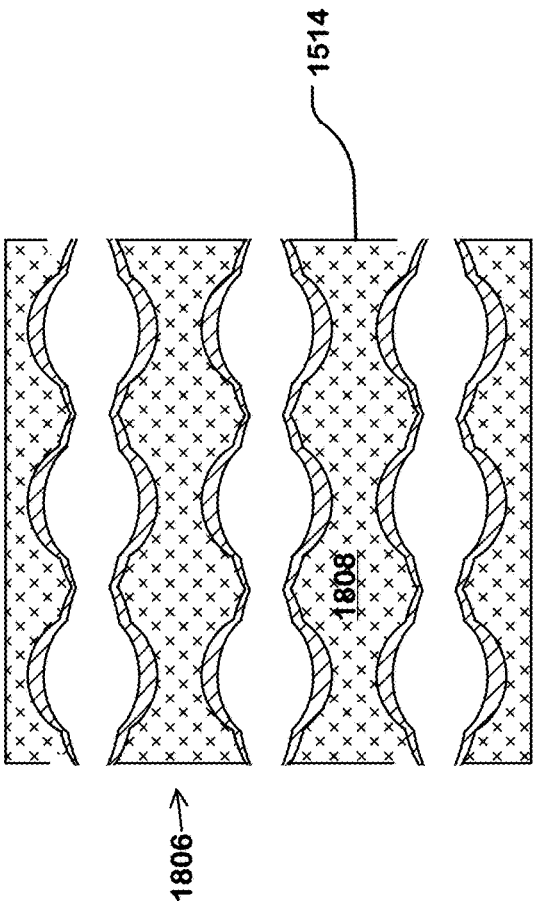

FIG. 15 illustrates an X-Z cross-section view of a stack of memory cells in a 3D cross-point memory fabricated with the example manufacturing process flow described in FIGS. 3-14. A "stack" of memory cells in an M-level 3D cross-point memory array, such as stack 1500, includes M number of memory cells stacked directly on top of each other. The stack 1500 includes the memory cell 1501 at the first level, the memory cell 1502 at the second level and the memory cell 1503 at the third level, stacked on top of other another. The memory cell 1501 comprises a programmable memory element 1521, a barrier layer 1522 and a switch element 1523. The memory cell 1502 in FIG. 15 comprises a programmable memory element 1531, a barrier layer 1532 and a switch element 1533. The memory cell 1503 in FIG. 15 comprises a programmable memory element 1541, a barrier layer 1542 and a switch element 1543.

FIGS. 16A, 16B and 16C illustrate X-Y layouts of the first level of memory cells 1602, the second level of memory cells 1604 and the third level of memory cells 1606, respectively, of the stack 1500 of memory cells in FIG. 15. The first level of memory cells 1602 in FIG. 16A includes the memory cell 1501 from FIG. 15. The second level of memory cells 1604 in FIG. 16B includes the memory cell 1502 from FIG. 15. The third level of memory cells 1606 in FIG. 16C includes the memory cell 1503 from FIG. 15. For clarity, only the X-Y layouts of programmable memory elements of the memory cells are shown in FIGS. 16A, 16B and 16C.

Figure 18A:
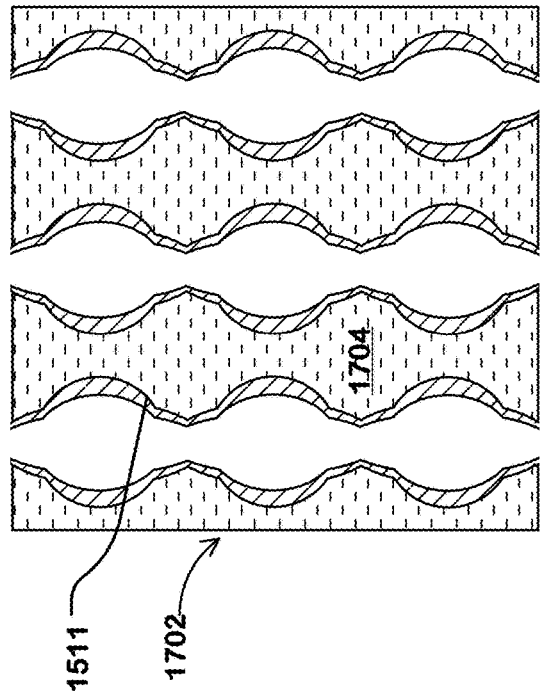
Figure 18B:
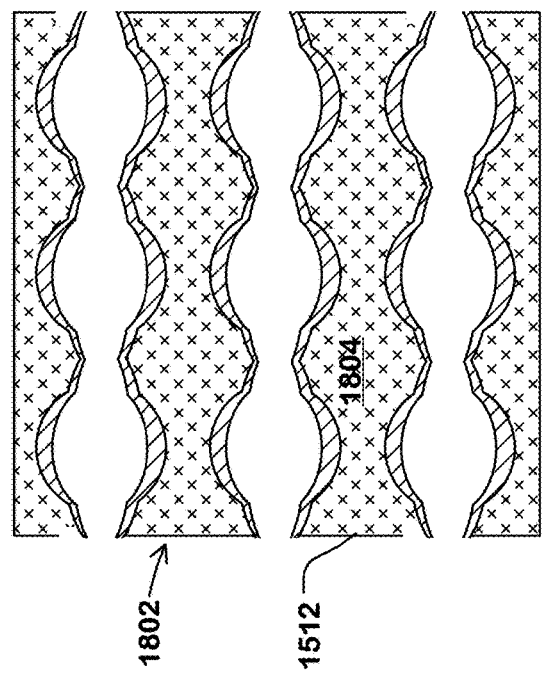

Referring to FIG. 15, the memory cells 1501, 1502 and 1503 are at cross-points between two first access line layers (the first access line layer 1702 in FIG. 17A and the first access line layer 1706 in FIG. 17B) and two second access line layers (the second access line layer 1802 in FIG. 18A and the second access line layer 1806 in FIG. 18B). The memory cell 1501 at the first level is interposed between the wide region (wide region 1704 in FIG. 17A) of the first access line 1511 of the first access line layer 1702 in FIG. 17A, and the wide region (wide region 1804 in FIG. 18A) of the second access line 1512 of the second access line layer 1802 in FIG. 18A. The memory cell 1502 at the second level is interposed between the wide region (wide region 1804 in FIG. 18A) of the second access line 1512 of the second access line layer 1802 in FIG. 18A, and the wide region (wide region 1708 in FIG. 17B) of the first access line 1513 of the first access line layer 1706 in FIG. 17B. The memory cell 1503 at the third level is interposed between the wide region (wide region 1708 in FIG. 17B) of the first access line 1513 of the first access line layer 1706 in FIG. 17B and the wide region (wide region 1808 in FIG. 18B) of the second access line 1514 of the second access line layer 1806 in FIG. 18B.

Figure 19:
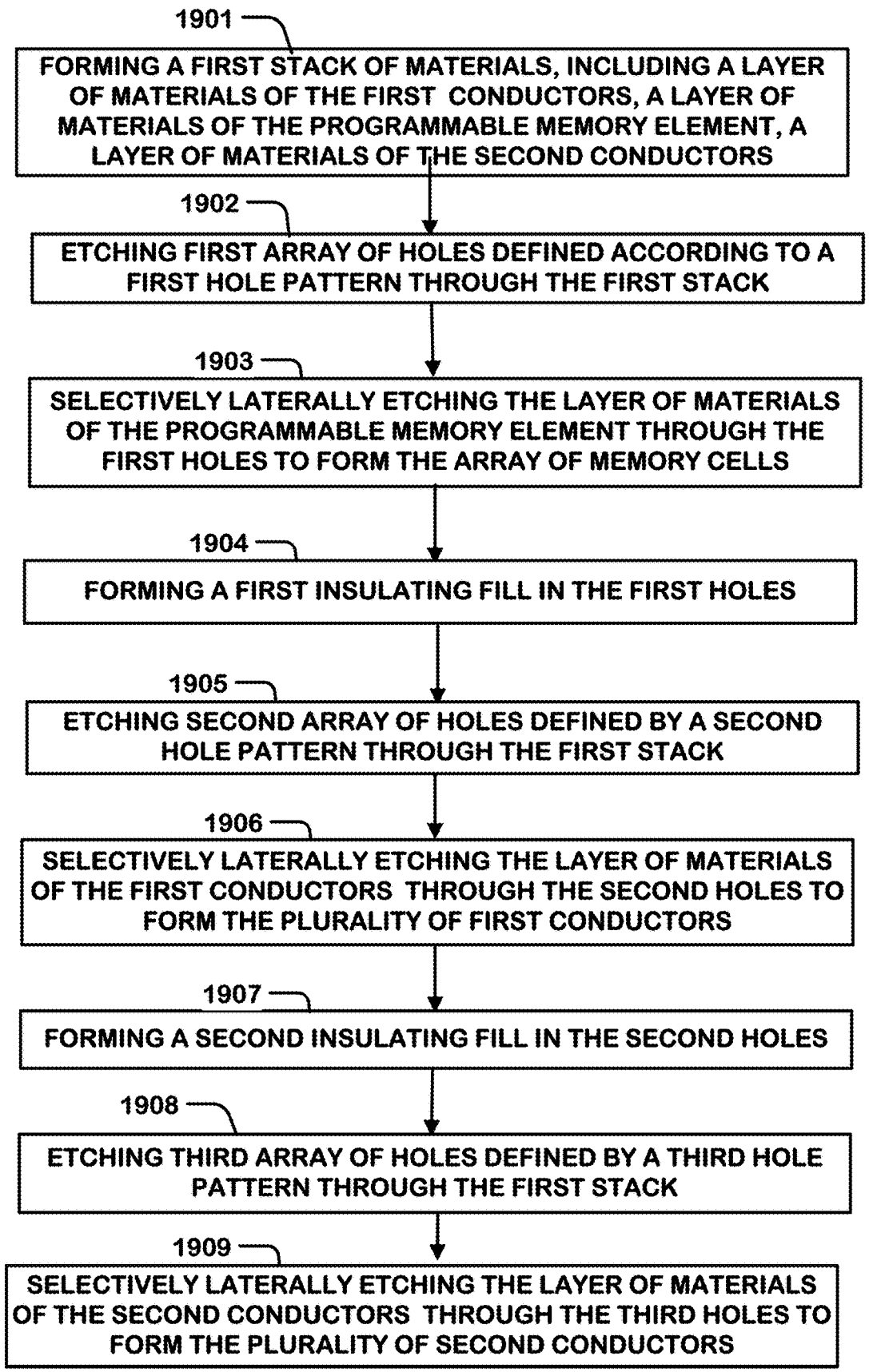
FIG. 19 is a flowchart illustrating a method for manufacturing a memory with a 3D cross-point memory with first and second access lines with alternating wide and narrow regions.

FIG. 19 is a flowchart illustrating a method for manufacturing a 3D cross-point memory with first and second access lines with alternating wide and narrow regions. The method includes forming a first stack of materials at 1901, including layers of a first conducting material, layers of materials of the programmable memory element, layers of materials of the barrier layer, layers of materials of the switch element, and layers of materials of a second conducting material (e.g., the first stack 300 in FIG. 3). At step 1902, a first array of holes including a plurality of first holes (e.g., the first holes 402, 404, 406, 408, 410, 412, 414, 416 and 418 in FIG. 4) are etched through the first stack according to a first hole pattern (e.g., the first hole pattern 424 in FIG. 4). At step 1903, the layers of materials of the programmable memory element, the layers of materials of the barrier layer and the layers of materials of the switch element are selectively laterally etched through the first holes to form an array of memory cells (e.g., the memory cells 602, 604, 606 and 608 in FIG. 6). At step 1904, a first insulating fill (e.g., the first insulating fill 720 in FIG. 7) is formed in the first holes. At step 1905, a second array of holes including a plurality of second holes (e.g., the second holes 802, 804, 806, 808, 810, 812, 814, 816 and 818 in FIG. 8) defined by a second hole pattern (e.g., the second hole pattern 824 in FIG. 8) are etched through the first stack. At step 1906, the layers of the first conducting material are selectively laterally etched through the second holes to form a plurality of first access lines (e.g., the first access lines 910 and 912 in FIG. 9). At step 1907, a second insulating fill (e.g., the second insulating fill 1020 in FIG. 10) is formed in the second holes. At step 1908, a third array of holes including a plurality of third holes (e.g., the third holes 1102, 1104, 1106, 1108, 1110, 1112, 1114, 1116 and 1118 in FIG. 11) defined by a third hole pattern (e.g., the third hole pattern 1124 in FIG. 11) are etched through the first stack. At step 1909, the layers of the second conducting material are selectively laterally etched through the third holes to form a plurality of second access lines (e.g., the second access lines 1210 and 1212 in FIG. 12).

The method includes forming a plurality of first access lines extending in a first direction, the first access lines having alternating wide regions and narrow regions (e.g., the first access lines 910 and 912 in FIG. 9).

The method includes forming a plurality of second access lines extending in a second direction (e.g., the second access lines 1210 and 1212 in FIG. 12). The second access lines have alternating wide regions and narrow regions. The wide regions in the second access lines of the plurality of second access lines overlay the wide regions in the first access lines of the plurality of first access lines at cross-points between the first and second access lines.

The method includes forming an array of memory cells (e.g., the memory cells 602, 604, 606 and 608 in FIG. 6) disposed in the cross-points between the first and second access lines (e.g., FIG. 15).

The method includes forming first access lines of a first conducting material and forming second access line of a second conducting material, the first material being different than the second material.

The method includes removing the first insulating fill and the second insulating fill, and exposing surfaces of the memory cells, the plurality of first access lines and the plurality of second access lines, and lining at least one of the exposed surfaces with a dielectric material to form dielectric liners (e.g., the dielectric liners 1410 in FIG. 14).

In some embodiments, the 3D cross-point memory device comprises a plurality of conductor layers stacked along first and second directions where each conductor layer includes conductor lines. A plurality of memory elements are located between the conductor layers. Each conductor line extending in a first direction comprises at least two inflection points or protrusion portions on the side walls of said conductor line extending along a second direction orthogonal to the first direction. The memory elements in the 3D cross-point memory device are separated from each other. In some embodiments, the memory elements are phase change memory material. In some embodiments, each memory element comprises a diamond shape. In some embodiments, each memory element is a pillar with four side walls. There are four inflection points between the four side walls in the memory element pillars. The shape of the inflection points are defined by the selectively laterally etching of the layers of materials of the programmable memory element, the layers of materials of the barrier layer and the layers of materials of the switch element through the first holes.

Another example manufacturing method comprises forming a stack of a first dummy layer, a memory layer and a second dummy layer; forming holes through the stack; selective etching to remove the partial region of the memory layer and forming a plurality of memory elements; filling in a dielectric material; forming first anisotropic through-holes, each first anisotropic through-hole extending in a first direction; selective etching to remove the partial region of the first dummy layer to connect the first anisotropic through-hole in the same column, and forming a plurality of first conductor lines; filling in the dielectric material; forming second anisotropic through-holes, each second anisotropic through-hole extending in a second direction; and selective etching to remove the partial region of the second dummy layer to connect the second anisotropic through-hole in same row, and forming a plurality of second conductor lines.

Figure 20:
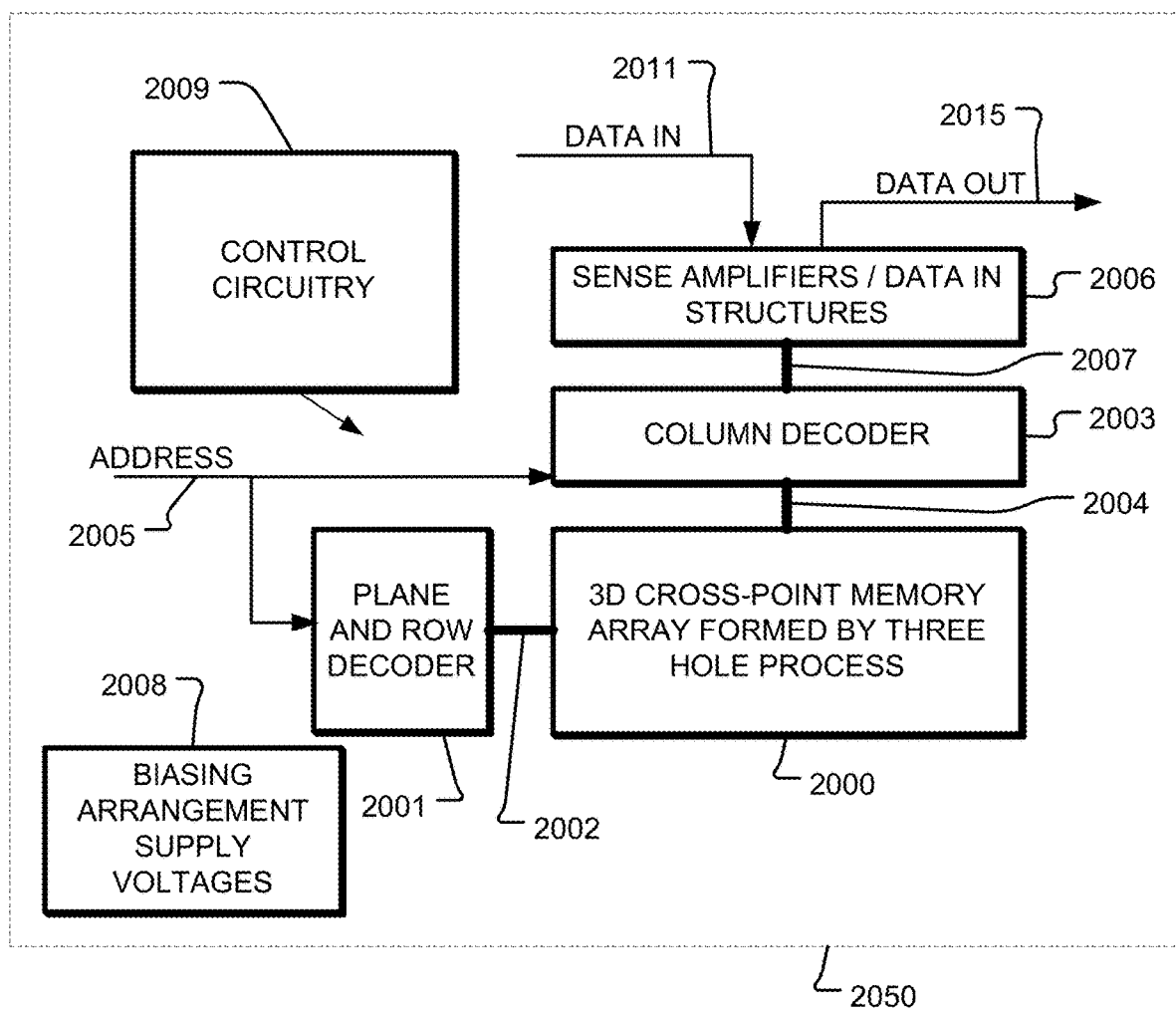
FIG. 20 is a simplified block diagram of an integrated circuit according to an embodiment of the present invention.

FIG. 20 shows an integrated circuit 2050 including a 3D cross-point memory array 2000 comprising memory cells and first and second access lines with alternating wide and narrow regions, as described herein, formed by a three-hole etch process. A plane and row decoder 2001 is coupled to, and in electrical communication with, a plurality of word lines 2002, and arranged along rows in the 3D cross-point memory array 2000. A column decoder 2003 is coupled to, and in electrical communication with, a plurality of bit lines 2004 arranged along columns in the 3D cross-point memory array 2000 for reading data from, and writing data to, the memory cells in the 3D cross-point memory array 2000. Addresses are supplied on bus 2005 to the plane and row decoder 2001 and to the column decoder 2003. Sense amplifiers and other supporting circuitry such as pre-charge circuits, etc., along with data-in structures in block 2006, are coupled to the column decoder 2003 via the bus 2007. Data is supplied via the data-in line 2011 from input/output ports on the integrated circuit 2050 or other data sources, to the data-in structures in block 2006. Data is supplied via the data-out line 2015 from the sense amplifiers in block 2006 to input/output ports on the integrated circuit 2050, or to other data destinations internal or external to the integrated circuit 2050. A bias arrangement state machine is in control circuitry 2009, controlling biasing arrangement supply voltages 2008, and the sense circuitry and the data-in structures in block 2006, for read and write operations. The control circuitry 2009 can be implemented using special purpose logic, a general purpose processor or a combination thereof, configured to execute the read, write and erase operations.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory, comprising:
   a plurality of first access lines extending in a first direction in a first access line layer, each first access line of the plurality of first access lines having alternating wider regions and narrower regions;
   a plurality of second access lines extending in a second direction in a second access line layer, each second access line of the plurality of second access lines having alternating wider regions and narrower regions, wherein the wider regions in second access lines of the plurality of second access lines directly overlie the wider regions in first access lines of the plurality of first access lines at cross-points between the first and second access lines; and
   an array of memory cells disposed in the cross-points between the first access lines in the first access line layer and second access lines in the second access line layer.

2. The memory of claim 1, wherein each first access line of the plurality of first access lines comprises a first conducting material and each second access line of the plurality of second access lines comprises a second conducting material, the first conducting material being different than the second conducting material.

3. The memory of claim 1, wherein each memory cell in the array of memory cells includes a switch element, a barrier layer, and a programmable memory element, in series.

4. The memory of claim 3, wherein the programmable memory element comprises a phase change material.

5. The memory of claim 1, wherein the memory cells in the array of memory cells are pillars.

6. The memory of claim 3, further including at least some memory cells of the memory cells are disposed such that the programmable memory elements are in contact with, or proximal to, a first access line of the plurality of first access lines and the switch elements are in contact with, or proximal to, a second access line of the plurality of second access lines.

7. The memory cell of claim 4, wherein the phase change material further includes chalcogenide-based materials.

8. The memory of claim 3, wherein the programmable memory element further includes at most one selected from a resistive random access memory and a ferroelectric random access memory.

9. The memory of claim 3, wherein the switch element further includes a two-terminal, bi-directional ovonic threshold switch (OTS).

10. A memory, including:
a plurality of first access lines extending in a first direction in a first access line layer, each first access line of the plurality of first access lines having alternating wider regions and narrower regions;
a plurality of second access lines extending in a second direction in a second access line layer, each second access line of the plurality of second access lines having alternating wider regions and narrower regions, wherein the wider regions in second access lines of the plurality of second access lines overlie the wider regions in first access lines of the plurality of first access lines at cross-points between the first and second access lines;
an array of memory cells disposed in the cross-points between the first access lines in the first access line layer and second access lines in the second access line layer;
a second plurality of first access lines extending in the first direction in a third access line layer, each first access line of the second plurality of access lines having alternating wider regions and narrower regions, wherein the wider regions in first access lines of the second plurality of first access lines in the third access line layer overlie the wider regions in second access lines of the plurality of second access lines in the second access line layer at cross-points between first access lines of the plurality of first access lines in the third access line layer and second access lines of the plurality of second access lines in the second access line layer; and
a second array of memory cells disposed in the cross-points between the first access lines in the third access line layer and the second access lines in the second access line layer.

* * * * *